(12) United States Patent
Yun et al.

(10) Patent No.: US 7,573,739 B2
(45) Date of Patent: Aug. 11, 2009

(54) MULTI-BIT ELECTROMECHANICAL MEMORY DEVICES AND METHODS OF MANUFACTURING THE SAME

(75) Inventors: Eunjung Yun, Seoul (KR); Sung-Young Lee, Yungin (KR); Dong-Won Kim, Sungnam (KR); Donggun Park, Sungnam (KR)

(73) Assignee: Samsung Electronics Co., Ltd. (KR)

( * ) Notice: Subject to any disclaimer, the term of this patent is extended or adjusted under 35 U.S.C. 154(b) by 340 days.

(21) Appl. No.: 11/713,770

(22) Filed: Mar. 2, 2007

(65) Prior Publication Data

US 2008/0048246 A1 Feb. 28, 2008

(30) Foreign Application Priority Data

Aug. 24, 2006 (KR) .................. 10-2006-0080203

(51) Int. Cl.
*G11C 11/34* (2006.01)
(52) U.S. Cl. .................. 365/185.03; 365/164
(58) Field of Classification Search ............ 365/185.03, 365/164
See application file for complete search history.

(56) References Cited

U.S. PATENT DOCUMENTS 5,886,922 A * 3/1999 Saito et al. ................. 365/164
7,092,272 B1 * 8/2006 Gilkey et al. ................ 365/164
7,336,527 B1 * 2/2008 McClelland ................ 365/164
7,463,513 B2 * 12/2008 Chung ........................ 365/164
2004/0181630 A1 9/2004 Jaiprakash et al.

* cited by examiner

*Primary Examiner*—Michael T Tran
(74) *Attorney, Agent, or Firm*—Mills & Onello, LLP

(57) ABSTRACT

In a memory device and a method of forming the same, in one embodiment, the memory device comprises a substrate and a bit line on the substrate extending in a first direction. A first word line structure is provided on the bit line and spaced apart from, and insulated from, the bit line, the first word line structure extending in a second direction transverse to the first direction. An electrode is coupled to the bit line extending over the first word line structure and spaced apart from the first word line structure by a first gap. A second word line structure is over the electrode and spaced apart from the electrode by a second gap, the second word line structure extending in the second direction. The electrode is cantilevered between the first word line structure and the second word line structure such that the electrode deflects to be electrically coupled with a top portion of the first word line structure through the first gap in a first bent position and deflects to be electrically coupled with a bottom portion of the second word line structure through the second gap in a second bent position, and is isolated from the first word line structure and the second word line structure in a rest position.

55 Claims, 32 Drawing Sheets

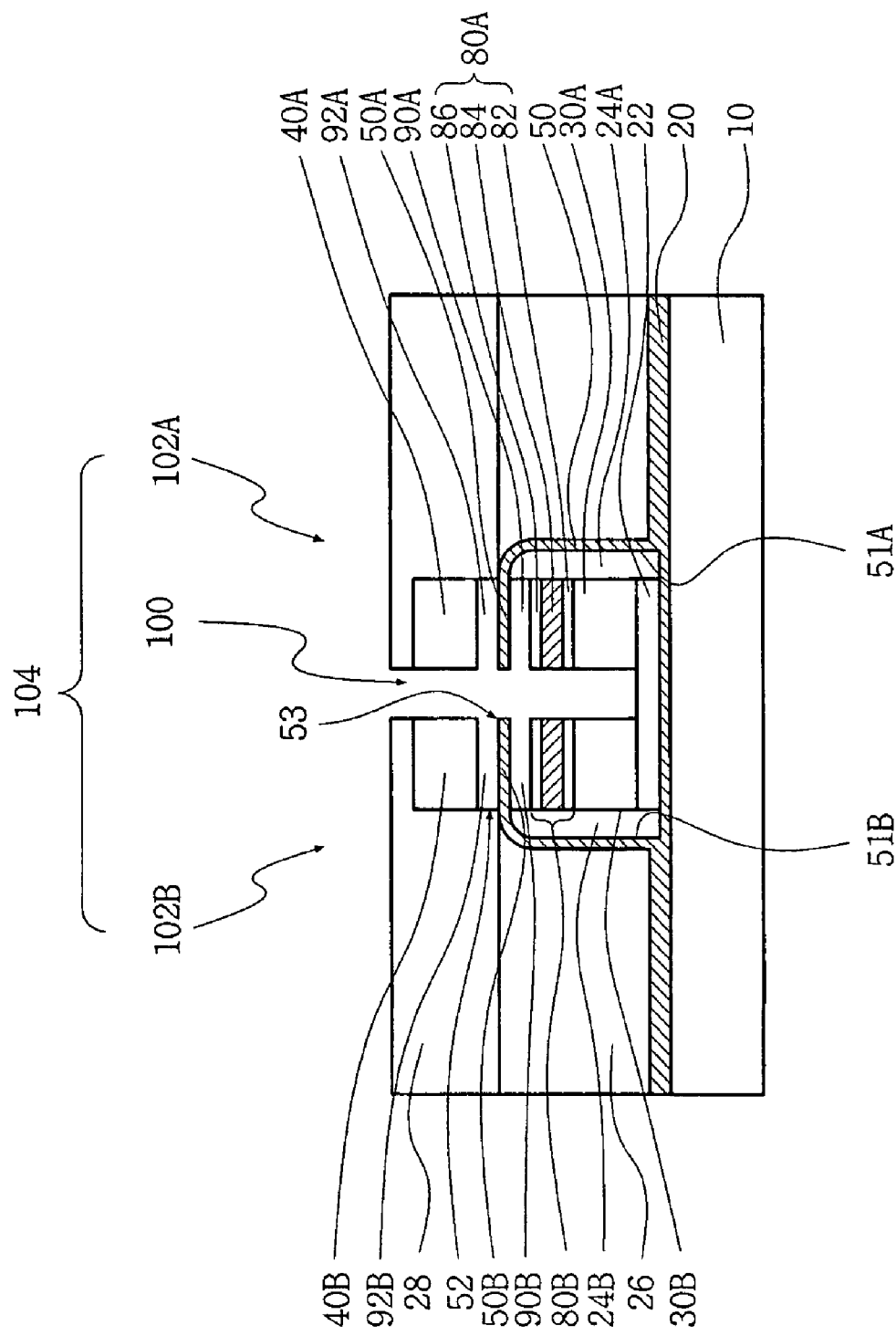

FIG.3A

OPERATION CONDITIONS

| | Read | Write"0" | Write"1" | Initial program | Erase (write all"0") |
|---|---|---|---|---|---|
| $V_{sel.B/L}$ | GND | ½$V_{pull-in}$ | ½$V_{pull-out}$ | ++ | GND |
| $V_{unsel.B/L}$ | GND | GND or floating | GND or floating | ++ | GND |
| $V_{sel.WWL}$ | GND | ½$V_{pull-out}$ | ½$V_{pull-in}$ | -- | -- |
| $V_{unsel.WWL}$ | GND | GND or floating | GND or floating | -- | -- |
| $V_{sel.RWL}$ | -- | GND or floating | GND or floating | GND | GND |
| $V_{unsel.RWL}$ | GND | GND or floating | GND or floating | GND | GND |

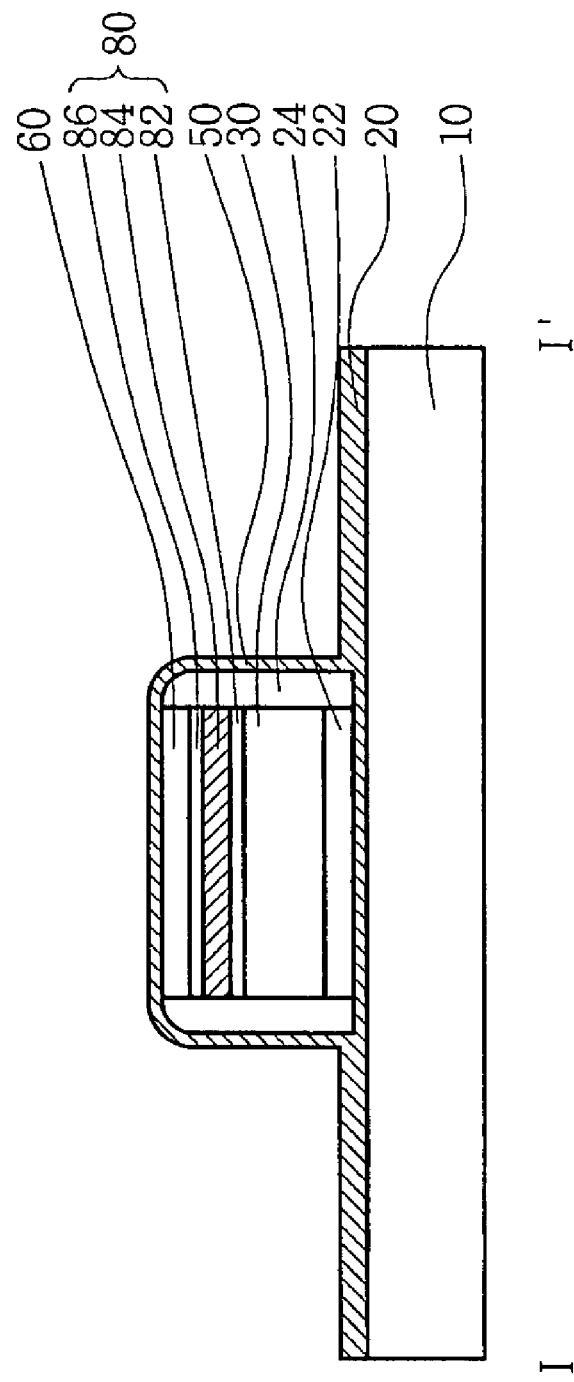

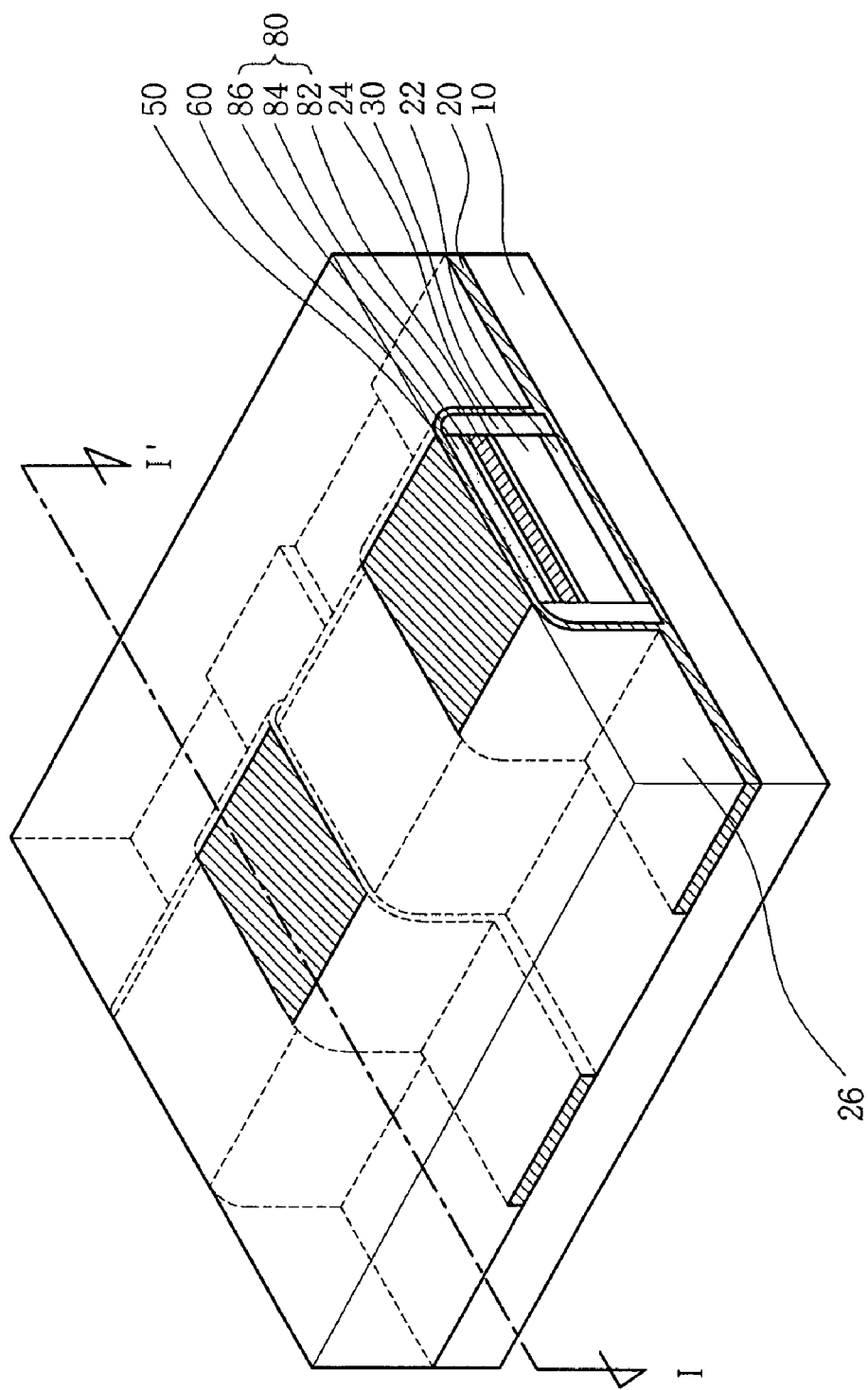

WRITE STATE="1"

READ"1"

MULTI-BIT ELECTROMECHANICAL MEMORY DEVICES AND METHODS OF MANUFACTURING THE SAME

RELATED APPLICATIONS

This application claims priority under 35 U.S.C. 119 to Korean Patent Application No. 10-2006-0080203 filed on Aug. 24, 2006, the content of which is incorporated herein by reference in its entirety.

This application is related to U.S. patent application Ser. No. 11/713,476, filed Mar. 2, 2007, entitled "Electromechanical Memory Devices and Methods of Manufacturing the Same," by Yun, et al., filed of even date herewith, incorporated herein by reference, and commonly owned with the present application.

BACKGROUND OF THE INVENTION

Semiconductor memory devices include memory cells for the storage of electronic information. Non-volatile memory devices enjoy widespread use because their associated memory cells can retain information even when the source power supply is disabled or removed. This feature makes non-volatile memory devices especially attractive for use in portable electronics. With the continuous trend toward higher integration, high-density layout, low-power operation, and high operating speed are common considerations for such devices.

One type of non-volatile device, referred to as flash memory, has become popular because it is relatively inexpensive to produce, and because it operates at relatively low power demands; however, flash memory is known to generally suffer from low operating speed, relatively poor data retention reliability and relatively short life span. In addition, such devices are based on the operation of conventional transistors, and with the pressures of further integration, they increasingly suffer from the short-channel effect, lowering of breakdown voltage, and lowering of reliability of the gate junction with repeated program/erase cycles. In addition, as the size of the transistor decreases, there is an increased likelihood of intercell interference, which can have a further adverse effect on performance and reliability.

SUMMARY OF THE INVENTION

Embodiments of the present invention are directed to multiple-bit electromechanical memory devices and methods of manufacture thereof that address and alleviate the above-identified limitations of conventional devices. In particular, embodiments of the present invention provide multiple-bit electromechanical memory devices that realize, among other features, high-density storage, low-voltage program and erase voltages, high-speed operation, enhanced data retention, and high long-term endurance, and methods of formation of such devices. The embodiments of the present invention are applicable to both non-volatile and volatile memory device formats.

In one aspect, a memory device comprises: a substrate; a bit line on the substrate extending in a first direction; a first word line structure on the bit line and spaced apart from, and insulated from, the bit line, the first word line structure extending in a second direction transverse to the first direction; an electrode coupled to the bit line extending over the first word line structure and spaced apart from the first word line structure by a first gap; and a second word line structure over the electrode and spaced apart from the electrode by a second gap, the second word line structure extending in the second direction, wherein the electrode is cantilevered between the first word line structure and the second word line structure such that the electrode deflects to be electrically coupled with a top portion of the first word line structure through the first gap in a first bent position and deflects to be electrically coupled with a bottom portion of the second word line structure through the second gap in a second bent position, and is isolated from the first word line structure and the second word line structure in a rest position.

In one embodiment, the first word line structure comprises a write word line and the second word line structure comprises a read word line.

In another embodiment, the memory device further comprises a first dielectric that isolates the first word line structure and the bit line in a vertical direction relative to the substrate.

In another embodiment, the memory device further comprises a second dielectric that isolates a side of the first word line structure and the electrode in a horizontal direction relative to the substrate.

In another embodiment, the second dielectric comprises a spacer at a side wall of the first word line structure In another embodiment, the electrode comprises a first portion that extends in a direction along a sidewall of the first word line structure and a second portion that extends from the first portion in a direction along a top of the first word line structure, between the first word line structure and the second word line structure.

In another embodiment, the first portion of the electrode includes a first end that is anchored to the second portion and a second end that deflects through the first gap and the second gap.

In another embodiment, the electrode comprises an elastically deformable material.

In another embodiment, the electrode comprises at least one material selected from the group consisting of: gold, silver, copper, aluminum, tungsten, TiN, conductive metal, shaped memory alloy, and nanotubes.

In another embodiment, the first word line structure and second word line structure each comprise a conductor, and wherein the memory device comprises a volatile memory device.

In another embodiment, at least one of the first word line structure and the second word line structure comprises: a conductive layer; and a charge trapping structure between the conductive layer and the electrode and spaced apart from the electrode by a corresponding one of the first and second gaps, and wherein the memory device comprises a non-volatile memory device.

In another embodiment, in at least one of the first bent position and second bent position, the electrode is capacitively coupled to the charge trapping structure of the corresponding at least one first word line structure and second word line structure.

In another embodiment, in the at least one of the first bent position and second bent position, the electrode is further capacitively coupled to the conductive layer of the corresponding at least one first word line structure and second word line structure.

In another embodiment, the charge trapping structure comprises a structure selected from the group consisting of: an oxide-nitride-oxide (ONO) structure and an oxide-nitride-alumina (ONA) structure.

In another embodiment, the memory device further comprises a transition layer between the conductive layer and the charge trapping structure of the at least one of the first and second word line structures.

In another embodiment, one of the first and second word line structures comprises a write word line structure and wherein another of the first and second word line structures comprises a read word line structure, and, during a programming operation of the non-volatile memory device, the electrode is placed in one of the a bent position in contact with the write word line structure and the rest position, by applying a first voltage potential between the write word line structure and the bit line.

In another embodiment, during a programming operation of a first state of the non-volatile memory device that results in the electrode being placed in a bent position in contact with the write word line structure, the electrode bends to make contact with the charge trapping structure of the write word line structure in the bent position in response to the first voltage potential between the write word line structure and the bit line, and wherein, when the first voltage potential between the write word line structure and the bit line is removed, the electrode remains in the bent position as a result of charge that is trapped in the charge trapping structure of the write word line structure.

In another embodiment, during a read operation of the non-volatile memory device in the first state, a second voltage potential is applied between the bit line and the read word line structure, and wherein the read operation results in the determination of the first state when the electrode remains in the bent position in contact with the write word line structure, despite application of the second voltage potential.

In another embodiment, during a programming operation of a second state of the non-volatile memory device that results in the electrode being placed in the rest position, the electrode is isolated from the charge trapping structure of the write word line structure in the rest position in response to the first voltage potential between the write word line structure and the bit line, and wherein, when the first voltage potential between the write word line structure and the bit line is removed, the electrode remains in the rest position.

In another embodiment, during a read operation of the non-volatile memory device in the second state, a second voltage potential is applied between the bit line and the read word line structure, and wherein the read operation results in the determination of the second state when the electrode is placed in a bent position in contact with the read word line structure as a result of the applied second voltage potential.

In another embodiment, the first word line structure comprises a conductive layer and a charge trapping structure on the conductive layer, the charge trapping structure between the conductive layer of the first word line structure and the electrode, and the charge trapping structure being spaced apart from the electrode by the first gap, and wherein the memory device comprises a non-volatile memory device.

In another embodiment, the second word line structure comprises a conductive layer and a charge trapping structure under the conductive layer, the charge trapping structure between the conductive layer of the second word line structure and the electrode, and the charge trapping structure being spaced apart from the electrode by the second gap, and wherein the memory device comprises a non-volatile memory device.

In another aspect, a memory device comprises: a substrate; a bit line on the substrate extending in a first direction; a first word line structure on the bit line and spaced apart from, and insulated from, the bit line, the first word line structure extending in a second direction transverse to the first direction; an electrode coupled to the bit line extending over the first word line structure and spaced apart from the first word line structure by a first gap; and a second word line structure over the electrode and spaced apart from the electrode by a second gap, the second word line structure extending in the second direction, wherein one of the first word line structure and second word line structure comprises a charge trapping structure between a conductive layer of the one of the word line structures and the electrode, wherein the charge trapping structure is spaced apart from the electrode by a corresponding one of the respective first and second gaps; wherein the electrode is cantilevered between the first word line structure and the second word line structure such that the electrode deflects to be electrically coupled with a top portion of the first word line structure through the first gap in a first bent position and deflects to be electrically coupled with a bottom portion of the second word line structure through the second gap in a second bent position, and is isolated from the first word line structure and the second word line structure in a rest position.

In one embodiment, the one of the first and second word line structures comprises a write word line and the other of the first and second word line structures comprises a read word line.

In another embodiment, the electrode comprises a first portion that extends in a direction along a sidewall of the first word line structure and a second portion that extends from the first portion in a direction along a top of the first word line structure, between the first word line structure and the second word line structure.

In another embodiment, the first portion of the electrode includes a first end that is anchored to the second portion and a second end that deflects through the first gap and the second gap.

In another embodiment, the electrode comprises an elastically deformable material.

In another embodiment, the electrode comprises at least one material selected from the group consisting of: gold, silver, copper, aluminum, tungsten, TiN, conductive metal, shaped memory alloy, and nanotubes.

In another embodiment, in at least one of the first bent position and second bent position, the electrode is capacitively coupled to the charge trapping structure of the corresponding at least one first word line structure and second word line structure.

In another embodiment, in the at least one of the first bent position and second bent position, the electrode is further capacitively coupled to the conductive layer of the corresponding at least one first word line structure and second word line structure.

In another embodiment, the charge trapping structure comprises a structure selected from the group consisting of: an oxide-nitride-oxide (ONO) structure and an oxide-nitride-alumina (ONA) structure.

In another embodiment, the memory device further comprises a transition layer between the conductive layer and the charge trapping structure of the at least one of the first and second word line structures.

In another embodiment, the one of the first and second word line structures comprises a write word line structure and wherein the other of the first and second word line structures comprises a read word line structure, and, during a programming operation of the non-volatile memory device, the electrode is placed in one of the a bent position in contact with the write word line structure and the rest position, by applying a first voltage potential between the write word line structure and the bit line.

In another embodiment, during a programming operation of a first state of the non-volatile memory device that results in the electrode being placed in a bent position in contact with the write word line structure, the electrode bends to make contact with the charge trapping structure of the write word line structure in the bent position in response to the first voltage potential between the write word line structure and the bit line, and, when the first voltage potential between the write word line structure and the bit line is removed, the electrode remains in the bent position as a result of charge that is trapped in the charge trapping structure of the write word line structure.

In another embodiment, during a read operation of the non-volatile memory device in the first state, a second voltage potential is applied between the bit line and the read word line structure, and wherein the read operation results in the determination of the first state when the electrode remains in the bent position in contact with the write word line structure, despite application of the second voltage potential.

In another embodiment, during a programming operation of a second state of the non-volatile memory device that results in the electrode being placed in the rest position, the electrode is isolated from the charge trapping structure of the write word line structure in the rest position in response to the first voltage potential between the write word line structure and the bit line, and wherein, when the first voltage potential between the write word line structure and the bit line is removed, the electrode remains in the rest position.

In another embodiment, during a read operation of the non-volatile memory device in the second state, a second voltage potential is applied between the bit line and the read word line structure, and wherein the read operation results in the determination of the second state when the electrode is placed in a bent position in contact with the read word line structure as a result of the applied second voltage potential.

In another aspect, a dual-bit memory device comprises: a substrate; a bit line on the substrate extending in a first direction; first and second lower word line structures on the bit line, the first and second lower word line structures being spaced apart from each other and spaced apart from, and insulated from, the bit line, each of the first and second lower word line structures extending in a second direction transverse to the first direction; first and second electrodes coupled to the bit line, the first electrode extending over the first lower word line structure and spaced apart from the first lower word line structure by a first lower gap; the second electrode extending over the second lower word line structure and spaced apart from the second lower word line structure by a second lower gap; and first and second upper word line structures over the respective first and second electrodes, the first and second upper word line structures being spaced apart from each other, the first upper word line structure being spaced apart from the first electrode by a first upper gap, the second upper word line structure being spaced apart from the second electrode by a second upper gap, each of the first and second upper word line structures extending in the second direction, wherein at least one pair of the first and second lower word line structures and the first and second upper word line structures comprises first and second charge trapping structures between first and second conductive layers of the respective first and second word line structures and the corresponding first and second electrodes, wherein the first and second charge trapping structures are spaced apart from the respective first and second electrodes by the respective first and second gaps, wherein the first electrode is cantilevered between the first lower word line structure and the first upper word line structure such that the first electrode deflects to be electrically coupled with a top portion of the first lower word line structure through the first lower gap in a first bent position and deflects to be electrically coupled with a bottom portion of the first upper word line structure through the first upper gap in a second bent position, and is isolated from the first lower word line structure and the first upper word line structure in a rest position, and wherein the second electrode is cantilevered between the second lower word line structure and the second upper word line structure such that the second electrode deflects to be electrically coupled with a top portion of the second lower word line structure through the second lower gap in a first bent position and deflects to be electrically coupled with a bottom portion of the second upper word line structure through the second upper gap in a second bent position, and is isolated from the second lower word line structure and the second upper word line structure in a rest position.

In one embodiment, the first and second electrodes each include a first end that is anchored and a second end that deflects through the first gap and the second gap.

In another embodiment, the first and second electrodes each comprise an elastically deformable material.

In another embodiment, in at least one of the first bent position and second bent position, an electrode is capacitively coupled to the charge trapping structure of the corresponding at least one upper and lower word line structure.

In another embodiment, in the at least one of the first bent position and second bent position, the electrode is further capacitively coupled to the conductive layer of the corresponding at least one upper and lower word line structure.

In another embodiment, the charge trapping structure comprises a structure selected from the group consisting of: an oxide-nitride-oxide (ONO) structure and an oxide-nitride-alumina (ONA) structure.

In another embodiment, the dual-bit memory device further comprises a transition layer between the conductive layer and the charge trapping structure of corresponding at least one upper and lower word line structures.

In another embodiment, one pair of the first and second lower word line structures and first and second upper word line structures comprises first and second write word line structures including the respecting first and second charge trapping structures and another pair of the first and second lower word line structures and first and second upper word line structures comprises first and second read word line structures and wherein, during a programming operation of the memory device: the first electrode is placed in either a bent position in contact with the charge trapping structure of the first write word line structure corresponding to a first state of the first electrode, or in the rest position corresponding to a second state of the first electrode, by applying a first voltage potential between the first write word line structure and the bit line; and the second electrode is placed in either a bent position in contact with the charge trapping structure of the second write word line structure corresponding to a first state of the second electrode or in the rest position corresponding to a second state of the second electrode, by applying a second voltage potential between the second write word line structure and the bit line, the programmed first and second states of the respective first and second electrodes being independent of each other, depending on the applied respective first and second voltage potentials.

In another embodiment, when the first voltage potential between the first write word line structure and the bit line is removed, the first electrode remains in the bent position as a result of charge that is trapped in the first charge trapping structure of the first write word line structure; and when the second voltage potential between the second write word line structure and the bit line is removed, the second electrode remains in the bent position as a result of charge that is trapped in the second charge trapping structure of the second write word line structure.

In another embodiment, during a read operation of the memory device: a third voltage potential is applied between the bit line and the first read word line structure, and wherein the read operation results in the determination of the first state when the first electrode remains in the bent position in contact with the first charge trapping structure of the first write word line structure despite application of the third voltage potential, and wherein the read operation results in the determination of the second state when the first electrode is placed in a bent position in contact with the first read word line structure as a result of application of the third voltage potential; and a fourth voltage potential is applied between the bit line and the second read word line structure, and wherein the read operation results in the determination of the first state when the second electrode remains in the bent position in contact with the second charge trapping structure of the second write word line structure despite application of the fourth voltage potential, and wherein the read operation results in the determination of the second state when the second electrode is placed in a bent position in contact with the second read word line structure as a result of application of the fourth voltage potential.

In another embodiment, the read operations of the respective first and second electrodes are performed by applying the corresponding third and fourth voltage potentials at different times.

In another embodiment, the electrode comprises at least one material selected from the group consisting of: gold, silver, copper, aluminum, tungsten, TiN, conductive metal, shaped memory alloy, and nanotubes.

In another aspect, a dual-bit memory device comprises: a substrate; a bit line on the substrate extending in a first direction; first and second lower word lines on the bit line, the first and second lower word lines being spaced apart from each other and spaced apart from, and insulated from, the bit line, each of the first and second lower word lines extending in a second direction transverse to the first direction; first and second electrodes coupled to the bit line, the first electrode extending over the first lower word line and spaced apart from the first lower word line by a first lower gap; the second electrode extending over the second lower word line and spaced apart from the second lower word line by a second lower gap; and first and second upper word lines over the respective first and second electrodes, the first and second upper word lines being spaced apart from each other, the first upper word line being spaced apart from the first electrode by a first upper gap, the second upper word line being spaced apart from the second electrode by a second upper gap, each of the first and second upper word lines extending in the second direction, wherein the first electrode is cantilevered between the first lower word line and the first upper word line such that the first electrode deflects to be electrically coupled with a top portion of the first lower word line through the first lower gap in a first bent position and deflects to be electrically coupled with a bottom portion of the first upper word line through the first upper gap in a second bent position, and is isolated from the first lower word line and the first upper word line in a rest position, and wherein the second electrode is cantilevered between the second lower word line and the second upper word line such that the second electrode deflects to be electrically coupled with a top portion of the second lower word line through the second lower gap in a first bent position and deflects to be electrically coupled with a bottom portion of the second upper word line through the second upper gap in a second bent position, and is isolated from the second lower word line and the second upper word line in a rest position.

In one embodiment, the first and second electrodes each include a first end that is anchored and a second end that deflects through the first gap and the second gap.

In another embodiment, the first and second electrodes each comprise an elastically deformable material.

In another embodiment, one pair of the first and second lower word lines and first and second upper word lines comprises first and second write word lines and wherein another pair of the first and second lower word lines and first and second upper word lines comprises first and second read word lines and wherein, during a programming operation of the memory device: the first electrode is placed in either a bent position in contact with the first write word line corresponding to a first state of the first electrode, or in the rest position corresponding to a second state of the first electrode, by applying a first voltage potential between the first write word line and the bit line; and the second electrode is placed in either a bent position in contact with the second write word line corresponding to a first state of the second electrode or in the rest position corresponding to a second state of the second electrode, by applying a second voltage potential between the second write word line and the bit line, the programmed first and second states of the respective first and second electrodes being independent of each other, depending on the applied respective first and second voltage potentials.

In another embodiment, during a read operation of the memory device: a third voltage potential is applied between the bit line and the first read word line, and wherein the read operation results in the determination of the first state when the first electrode remains in the bent position in contact with the first write word line despite application of the third voltage potential, and wherein the read operation results in the determination of the second state when the first electrode is placed in a bent position in contact with the first read word line as a result of application of the third voltage potential; and a fourth voltage potential is applied between the bit line and the second read word line, and wherein the read operation results in the determination of the first state when the second electrode remains in the bent position in contact with the second write word line despite application of the fourth voltage potential, and wherein the read operation results in the determination of the second state when the second electrode is placed in a bent position in contact with the second read word line as a result of application of the fourth voltage potential.

In another embodiment, the read operations of the respective first and second electrodes are performed by applying the corresponding third and fourth voltage potentials at different times.

In another aspect, a method of forming a memory device comprises: providing a bit line on a substrate extending in a first direction; sequentially providing a first insulating layer, a lower word line layer and a first sacrificial layer on the bit line, and patterning to form a patterned first sacrificial layer and a lower word line that extends in a second direction transverse to the first direction; providing insulating spacers at sidewalls of the lower word line; providing an electrode coupled to the bit line extending over the patterned first sacrificial layer and the lower word line, the electrode contacting the bit line at a first position at a first side of the lower word line and at a second position at a second side of the lower word line; sequentially providing a second sacrificial layer and an upper word line layer on the electrode, and patterning to form a patterned second sacrificial layer and an upper word line that extends in the second direction; providing a trench through the upper word line, the electrode, and the lower word line, the trench extending in the second direction to define first and second upper word lines, first and second electrodes, and first and second lower word lines that are respectively spaced apart from each other by the trench; and removing the first and second patterned sacrificial layers to form first and second lower gaps between the first and second electrodes and the first and second lower word lines respectively, and to form first and second upper gaps between the first and second electrodes and the first and second upper word lines respectively.

In one embodiment, the memory device comprises a volatile memory device and wherein: the first electrode is cantilevered between the first lower word line and the first upper word line such that the first electrode deflects to be electrically coupled with a top portion of the first lower word line through the first lower gap in a first bent position and to be electrically coupled with a bottom portion of the first upper word line through the first upper gap in a second bent position, and is isolated from the first lower word line and the first upper word line in a rest position; and the second electrode is cantilevered between the second lower word line and the second upper word line such that the second electrode deflects to be electrically coupled with a top portion of the second lower word line through the second lower gap in a first bent position and to be electrically coupled with a bottom portion of the second upper word line through the second upper gap in a second bent position, and is isolated from the second lower word line and the second upper word line in a rest position.

In another embodiment, the memory device comprises a non-volatile memory device and further comprising: providing a charge trapping structure on the lower word line layer, and wherein the trench further defines first and second charge trapping structures on the respective first and second lower word lines, the first and second charge trapping structures between the first and second lower word lines and the first and second electrodes, and spaced apart from the first and second electrodes by the first and second lower gaps, and wherein the first electrode is cantilevered between the first charge trapping structure and the first upper word line such that the first electrode deflects to be electrically coupled with a top portion of the first charge trapping structure through the first lower gap in a first bent position and to be electrically coupled with a bottom portion of the first upper word line through the first upper gap in a second bent position, and is isolated from the first charge trapping structure and the first upper word line in a rest position; and the second electrode is cantilevered between the second charge trapping structure and the second upper word line such that the second electrode deflects to be electrically coupled with a top portion of the second charge trapping structure through the second lower gap in a first bent position and to be electrically coupled with a bottom portion of the second upper word line through the second upper gap in a second bent position, and is isolated from the second charge trapping structure and the second upper word line in a rest position.

In another embodiment, in the first bent positions, the first and second electrodes are capacitively coupled to the respective first and second charge trapping structures.

In another embodiment, in the first bent positions, the first and second electrodes are further capacitively coupled to the respective first and second lower word lines.

In another embodiment, the charge trapping structure comprises a structure selected from the group consisting of: an oxide-nitride-oxide (ONO) structure and an oxide-nitride-alumina (ONA) structure.

In another embodiment, the memory device comprises a non-volatile memory device and further comprising: providing a charge trapping structure on second sacrificial layer below the upper word line, and wherein the trench further defines first and second charge trapping structures below the respective first and second upper word lines, the first and second charge trapping structures between the first and second upper word lines and the first and second electrodes, and spaced apart from the first and second electrodes by the first and second upper gaps, and wherein the first electrode is cantilevered between the first charge trapping structure and the first lower word line such that the first electrode deflects to be electrically coupled with a top portion of the first lower word line through the first lower gap in a first bent position and to be electrically coupled with a bottom portion of the first charge trapping structure through the first upper gap in a second bent position, and is isolated from the first lower word line and the first charge trapping structure in a rest position; and the second electrode is cantilevered between the second charge trapping structure and the second lower word line such that the second electrode deflects to be electrically coupled with a top portion of the second lower word line through the second lower gap in a first bent position and to be electrically coupled with a bottom portion of the second charge trapping structure through the second upper gap in a second bent position, and is isolated from the second lower word line and the second charge trapping structure in a rest position.

In another embodiment, in the second bent positions, the first and second electrodes are capacitively coupled to the respective first and second charge trapping structures.

In another embodiment, in the second bent positions, the first and second electrodes are further capacitively coupled to the respective first and second upper word lines.

In another embodiment, the charge trapping structure comprises a structure selected from the group consisting of: an oxide-nitride-oxide (ONO) structure and an oxide-nitride-alumina (ONA) structure.

In another embodiment, providing a trench further comprises: providing a hard-mask layer on the second sacrificial layer and upper word line, and wherein patterning comprises patterning the second sacrificial layer and upper word line using the hard mask layer, and performing a pull-back operation on the hard mask layer to provide a reduced-width hard mask layer, and wherein providing the trench comprises providing the trench using the reduced-width hard mask layer to define a width of the trench.

In another aspect, a method of forming a memory device comprising: providing a bit line on a substrate, the bit line extending in a first direction on the substrate; providing a first word line structure on the bit line and spaced apart from, and insulated from, the bit line, the first word line structure extending in a second direction on the substrate transverse to the first direction; providing an electrode coupled to the bit line extending over the first word line structure and spaced apart from the first word line structure by a first gap; and providing a second word line structure over the electrode and spaced apart from the electrode by a second gap, the second word line structure extending in the second direction, wherein the electrode is cantilevered between the first word line structure and the second word line structure such that the electrode deflects to be electrically coupled with a top portion of the first word line structure through the first gap in a first bent position and deflects to be electrically coupled with a bottom portion of the second word line structure through the second gap in a second bent position, and is isolated from the first word line structure and the second word line structure in a rest position.

In one embodiment, providing the electrode comprises providing a first portion that extends in a direction along a sidewall of the first word line structure and providing a second portion that extends from the first portion in a direction along a top of the first word line structure, between the first word line structure and the second word line structure.

In another embodiment, the first portion of the electrode includes a first end that is anchored to the second portion and a second end that deflects through the first gap and the second gap.

In another embodiment, the electrode comprises an elastically deformable material.

In another embodiment, the electrode comprises at least one material selected from the group consisting of: gold, silver, copper, aluminum, tungsten, TiN, conductive metal, shaped memory alloy, and nanotubes.

In another embodiment, the first word line structure and second word line structure each comprise a conductor, and wherein the memory device comprises a volatile memory device.

In another embodiment, at least one of the first word line structure and the second word line structure comprises: a conductive layer; and a charge trapping structure between the conductive layer and the electrode and spaced apart from the electrode by a corresponding one of the first and second gaps, and wherein the memory device comprises a non-volatile memory device.

In another embodiment, in at least one of the first bent position and second bent position, the electrode is capacitively coupled to the charge trapping structure of the corresponding at least one first word line structure and second word line structure.

In another embodiment, in the at least one of the first bent position and second bent position, the electrode is further capacitively coupled to the conductive layer of the corresponding at least one first word line structure and second word line structure.

In another embodiment, the charge trapping structure comprises a structure selected from the group consisting of: an oxide-nitride-oxide (ONO) structure and an oxide-nitride-alumina (ONA) structure.

In another embodiment, the method further comprises providing a transition layer between the conductive layer and the charge trapping structure of the at least one of the first and second word line structures.

In another embodiment, one of the first and second word line structures comprises a write word line structure and wherein another of the first and second word line structures comprises a read word line structure, and wherein, during a programming operation of the non-volatile memory device, the electrode is placed in one of the a bent position in contact with the write word line structure and the rest position, by applying a first voltage potential between the write word line structure and the bit line.

In another embodiment, during a programming operation of a first state of the non-volatile memory device that results in the electrode being placed in a bent position in contact with the write word line structure, the electrode bends to make contact with the charge trapping structure of the write word line structure in the bent position in response to the first voltage potential between the write word line structure and the bit line, and wherein, when the first voltage potential between the write word line structure and the bit line is removed, the electrode remains in the bent position as a result of charge that is trapped in the charge trapping structure of the write word line structure.

In another embodiment, during a read operation of the non-volatile memory device in the first state, a second voltage potential is applied between the bit line and the read word line structure, and wherein the read operation results in the determination of the first state when the electrode remains in the bent position in contact with the write word line structure, despite application of the second voltage potential.

In another embodiment, during a programming operation of a second state of the non-volatile memory device that results in the electrode being placed in the rest position, the electrode is isolated from the charge trapping structure of the write word line structure in the rest position in response to the first voltage potential between the write word line structure and the bit line, and wherein, when the first voltage potential between the write word line structure and the bit line is removed, the electrode remains in the rest position.

In another embodiment, during a read operation of the non-volatile memory device in the second state, a second voltage potential is applied between the bit line and the read word line structure, and wherein the read operation results in the determination of the second state when the electrode is placed in a bent position in contact with the read word line structure as a result of the applied second voltage potential.

In another aspect, a stacked memory device comprises: a first device layer including a first array of memory cells; a second device layer including a second array of memory cells; a third device layer including control circuitry for accessing the first array of memory cells and the second array of memory cells, the first, second and third device layers being vertically arranged with respect to each other, wherein the memory cells of the first array of memory cells and the second array of memory cells each include: a first word line structure; a second word line structure spaced apart from the first word line structure; and an electrode that extends over an upper surface of the first word line structure and below a lower surface of the second word line structure, the electrode coupled to a bit line of the device, the electrode being spaced apart from the first word line structure by a first gap and being spaced apart from the second word line structure by a second gap, the electrode being cantilevered between the first word line structure and the second word line structure.

In one embodiment, the memory cells of the first array of memory cells are non-volatile memory cells and the memory cells of the second array of memory cells are volatile memory cells.

In another embodiment, the memory cells of both the first array of memory cells and the second array of memory cells are volatile memory cells.

In another embodiment, the memory cells of both the first array of memory cells and the second array of memory cells are non-volatile memory cells.

In another embodiment, in each of the memory cells, the electrode comprises a first portion that extends in a direction along a sidewall of the first word line structure and a second portion that extends from the first portion in a direction along a top of the first word line structure, between the first word line structure and the second word line structure.

In another embodiment, the first portion of the electrode includes a first end that is anchored to the second portion and a second end that deflects through the first gap and the second gap.

In another embodiment, in each of the memory cells, the electrode comprises an elastically deformable material.

In another embodiment, the electrode comprises at least one material selected from the group consisting of: gold, silver, copper, aluminum, tungsten, TiN, conductive metal, shaped memory alloy, and nanotubes.

In another embodiment, the memory cells of at least one of the first array and second array comprise volatile memory cells, and in the at least one array, the first word line structure and second word line structure each comprise a conductor.

In another embodiment, in each of the memory cells, the electrode is cantilevered between the first word line structure and the second word line structure such that the electrode deflects to be electrically coupled with a top portion of the first word line structure through the first gap in a first bent position and deflects to be electrically coupled with a bottom portion of the second word line structure through the second gap in a second bent position, and is isolated from the first word line structure and the second word line structure in a rest position.

In another embodiment, the memory cells of at least one of the first array and second array comprise non-volatile memory cells, and in the memory cells of the at least one array, at least one of the first word line structure and the second word line structure comprises: a conductive layer; and a charge trapping structure between the conductive layer and the electrode and spaced apart from the electrode by a corresponding one of the first and second gaps, and wherein the memory device comprises a non-volatile memory device.

In another embodiment, in the memory cells of the at least one array, in at least one of the first bent position and second bent position, the electrode is capacitively coupled to the charge trapping structure of the corresponding at least one first word line structure and second word line structure.

In another embodiment, in the at least one of the first bent position and second bent position, the electrode is further capacitively coupled to the conductive layer of the corresponding at least one first word line structure and second word line structure.

In another embodiment, the charge trapping structure comprises a structure selected from the group consisting of: an oxide-nitride-oxide (ONO) structure and an oxide-nitride-alumina (ONA) structure.

In another embodiment, the stacked memory device further comprises in the memory cells of the at least one array, a transition layer between the conductive layer and the charge trapping structure of the at least one of the first and second word line structures.

In another embodiment, one of the first and second word line structures comprises a write word line structure and another of the first and second word line structures comprises a read word line structure, and, during a programming operation of the non-volatile memory device, the electrode is placed in one of the a bent position in contact with the write word line structure and the rest position, by applying a first voltage potential between the write word line structure and the bit line.

In another embodiment, during a programming operation of a first state of the non-volatile memory device that results in the electrode being placed in a bent position in contact with the write word line structure, the electrode bends to make contact with the charge trapping structure of the write word line structure in the bent position in response to the first voltage potential between the write word line structure and the bit line, and wherein, when the first voltage potential between the write word line structure and the bit line is removed, the electrode remains in the bent position as a result of charge that is trapped in the charge trapping structure of the write word line structure.

In another embodiment, during a read operation of the non-volatile memory device in the first state, a second voltage potential is applied between the bit line and the read word line structure, and wherein the read operation results in the determination of the first state when the electrode remains in the bent position in contact with the write word line structure, despite application of the second voltage potential.

In another embodiment, during a programming operation of a second state of the non-volatile memory device that results in the electrode being placed in the rest position, the electrode is isolated from the charge trapping structure of the write word line structure in the rest position in response to the first voltage potential between the write word line structure and the bit line, and wherein, when the first voltage potential between the write word line structure and the bit line is removed, the electrode remains in the rest position.

In another embodiment, during a read operation of the non-volatile memory device in the second state, a second voltage potential is applied between the bit line and the read word line structure, and wherein the read operation results in the determination of the second state when the electrode is placed in a bent position in contact with the read word line structure as a result of the applied second voltage potential.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings:

FIG. 2B is a sectional view taken along section lines I-I' of FIG. 2A;

FIG. 3A is an example chart of applied voltages for performing programming, write, erase and read operations of the unit memory cell embodiment of FIGS. 2A and 2B.

FIGS. 6A-15A are perspective views of a method for forming a multiple-bit electromechanical non-volatile memory device in accordance with an embodiment of the present invention. FIGS. 6B-15B are sectional views taken along section lines I-I' of FIGS. 6A-15A;

DETAILED DESCRIPTION OF EMBODIMENTS

Embodiments of the present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

It will be understood that, although the terms first, second, etc. are used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.). When an element is referred to herein as being "over" another element, it can be over or under the other element, and either directly coupled to the other element, or intervening elements may be present, or the elements may be spaced apart by a void or gap. As used herein, the term "word line structure" can include a conductive word line itself, or a conductive word line and corresponding charge trapping structure, or additional structures or components that are associated with the word line.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Figure 1:
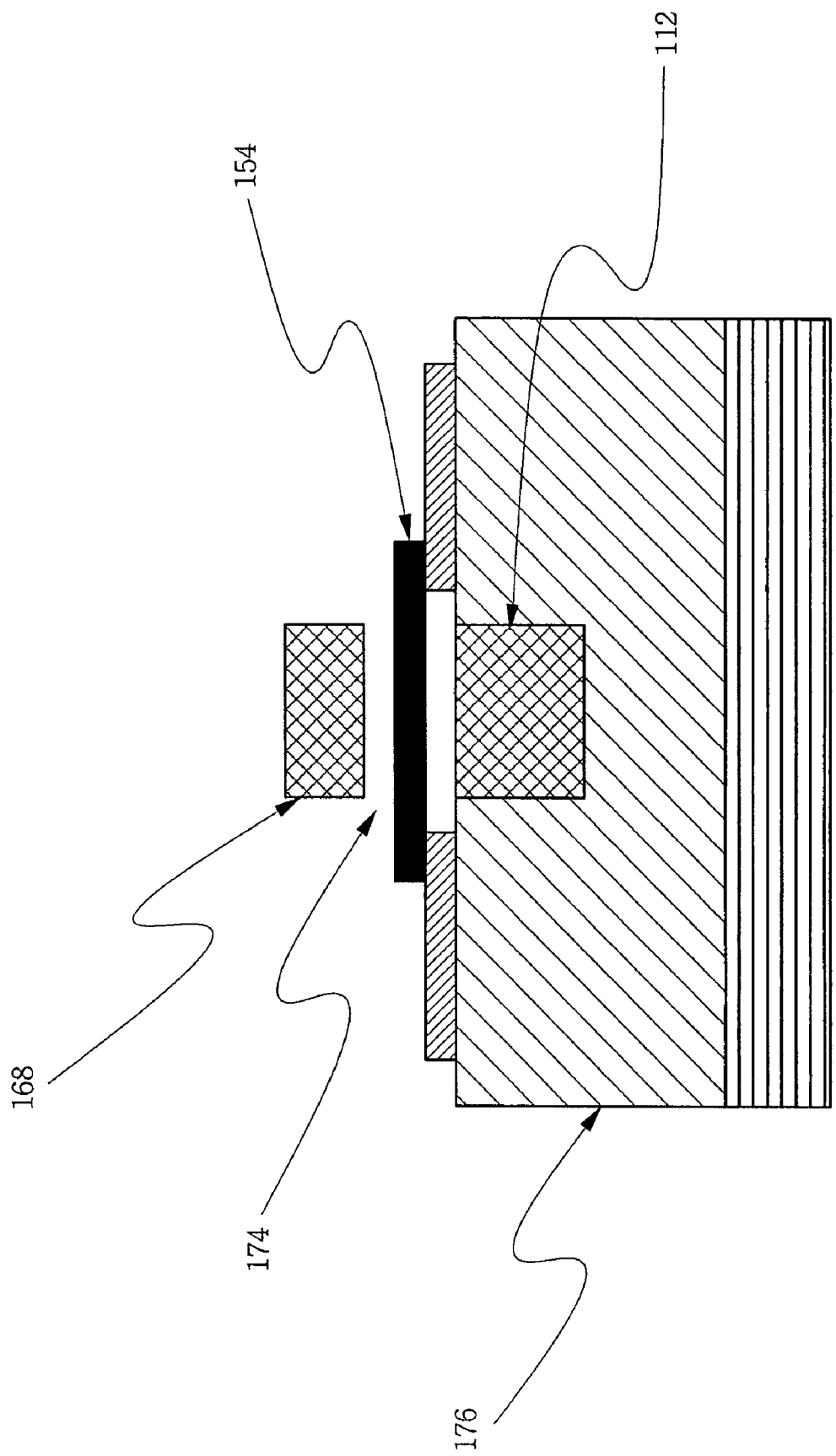
FIG. 1 is a cross-sectional view of an illustrative embodiment of a conventional type of memory device that utilizes electromechanical interaction for programming the state of the device.

Next-generation, emerging technologies are under development in an effort to address the limitations associated with contemporary flash memory platforms. One such design is disclosed by Jaiprakash, et al., U.S. Patent Application Publication 2004/0181630, the content of which is incorporated herein by reference. FIG. 1 is a cross-sectional view of an illustrative embodiment of the type of device disclosed in the Jaiprakash, et al. reference.

With reference to FIG. 1, this system relies on a flexible fabric 154 that operates as a mechanical switch that is suspended in the gaps 174 between first and second electrodes 168, 112. The position of the fabric 154 relative to the electrodes 168, 122 is programmable to provide data states, so that the device is operable as a switch. The flexible fabric 154 is formed of a carbon nanotube material, which is expensive to produce, and the accurate placement of which in a semiconductor manufacturing process is difficult to control. In addition, this device is not readily manufacturable in a dense array of cells; therefore, its application to low-cost, high-density semiconductor devices is somewhat limited.

Embodiments of the present invention as illustrated herein provide multiple-bit electromechanical memory devices that provide, among other features, high-density storage, low-voltage program and erase voltages, high-speed operation, enhanced data retention, and high longevity, and methods of formation of such devices. Data retention is ensured by Coulomb forces, rather than through electron tunneling. This leads to enhanced longevity and longer, and more reliable, data retention. In addition, further integration of the devices is not limited by the short-channel effect or by lowering of breakdown voltage. Also, device longevity is maintained through repeated program/erase cycles, since such cycles are not dependent on the properties of gate insulator materials. In addition, intercell interference is mitigated or eliminated because cell data status is determined mechanically, rather than electrically. A relatively simple manufacturing process can be used to form the devices, using standard fabrication techniques.

Figure 2A:
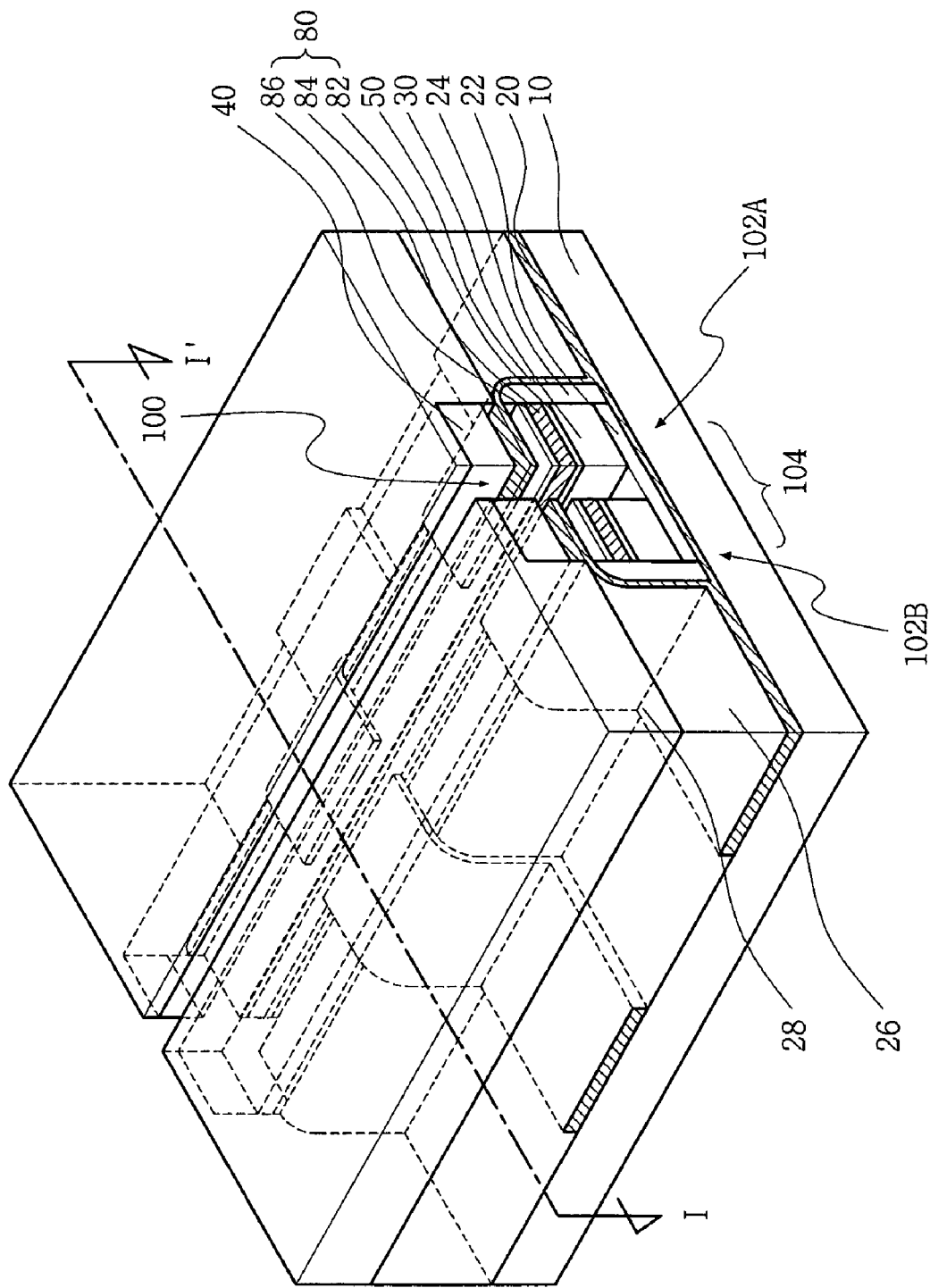
FIG. 2A is a perspective view of a multiple-bit electromechanical non-volatile memory device in accordance with an embodiment of the present invention.

FIG. 2A is a perspective view of a multiple-bit electromechanical non-volatile memory device in accordance with an embodiment of the present invention. FIG. 2B is a sectional view taken along section lines I-I' of FIG. 2A.

With reference to FIGS. 2A and 2B, multiple bit lines 20 extend on a substrate 10 in a first direction. A first interlayer dielectric layer 22 extends across the multiple bit lines 20 on the multiple bit lines 20 and the substrate 10 in a second direction that is transverse to the first direction. First and second lower word lines 30A, 30B extend in the second direction on the first interlayer dielectric layer 22, and are spaced apart from each other by a trench 100 that also extends in the second direction. First and second charge trapping structures 80A, 80B are on the first and second lower word lines 30A, 30B and likewise extend in the second direction, and are likewise spaced apart from each other in the first direction by the trench 100. The term "transverse", when referring to the first and second directions of extension of the various components, refers to relative directions of extension that are other than parallel to each other, and includes, for example, any angle, including 90 degrees, with respect to each other.

First and second electrodes 50A, 50B are suspended over the respective first and second charge trapping structures 80A, 80B and are spaced apart from the charge trapping structures 80A, 80B in a vertical direction by first and second lower gaps 90A, 90B. The first and second electrodes 50A, 50B include first portions that extend generally in a horizontal direction, parallel to an upper surface of the substrate 10, and are coupled to a common bit line 20 via respective second portions 51A, 51B of the electrodes 50A, 50B that extend generally in a vertical direction. Ends of the first and second electrodes 50A, 50B face each other, and are spaced apart from each other by the trench 100.

First and second upper word lines 40A, 40B are positioned over the corresponding first and second electrodes 50A, 50B, and are spaced apart from the first and electrodes 50A, 50B in a vertical direction by first and second upper gaps 92A, 92B. The first and second upper word lines 40A, 40B are spaced apart from each other by the trench 100, and extend in the second direction over the first and second charge trapping structures 80A, 80B.

The second portions 51A, 51B of the first and second electrodes 50A, 50B are isolated from outer sidewalls of the lower word lines 30A, 30B and outer sidewalls of the charge trapping layers 80A, 80B by insulative sidewall spacers 24A, 24B. A second dielectric layer 26 is provided on the bit line 20 and substrate 10 to fill in regions between adjacent cells 104 in the first direction, and insulates outer side walls of the first and second electrodes 50A, 50B. A third dielectric layer 26 is provided on the second dielectric layer 24 and insulates outer side walls of the first and second upper word lines 40A, 40B.

A unit cell 104 of the illustrated device includes first and second memory units 102A, 102B that are separated by the trench 100. The first and second memory units 102A, 102B neighboring each other in the first direction, and those memory units 102A, 102B of neighboring unit cells 104 in the first direction, share a common bit line 20. The respective first and second memory units 102A, 102B of unit cells 104 neighboring each other in the second direction, share a common, respective first or second lower word line 30A, 30B and share a common, respective first or second upper word line 40A, 40B. In one embodiment, the charge trapping structures 80A, 80B correspond to, and are formed on, the lower word lines 30A, 30B, as shown, and therefore, the lower word lines 30A, 30B operate as write word lines for the corresponding memory units 102A, 102B, and the upper word lines 40A, 40B operate as read word lines for the corresponding memory units 102A, 102B. In another embodiment, the charge trapping layer structures 80A, 80B can be formed below the upper word lines 40A, 40B, and in this embodiment, the lower word lines 30A, 30B operate as read word lines for the corresponding memory units 102A, 102B, and the upper word lines 40A, 40B operate as write word lines for the corresponding memory units 102A, 102B. The operation of the read and write word lines will be described in further detail below.

In the illustrative embodiment depicted in FIGS. 2A and 2B, a first, proximal, end 52 of each of the first and second electrodes 50A, 50B is embedded in, or otherwise supported by, the second and/or third interlayer dielectric layers 26, 28, and a second, distal, end 53 of the electrodes 50A, 50B is freely movable in the respective upper and lower gaps 90, 92 between the write word lines 30 and the read word lines 40. In this manner, the electrodes 50 are cantilevered in position in the gaps 90, 92 between the word lines 30, 40 since the proximal end 52 of each electrode 50 is fixed, and the distal end 53 is freely moveable. By controlling the position of the cantilevered electrode 50 in the gaps 90, 92, the electrode 50 can be caused to make contact, for example, in an engaged position, with the charge trapping structure 80 or the read word line 40, or can be made to be suspended, for example, in a rest position, between the charge trapping structure 80 and the read word lines 40 and not make contact with either. By controlling the respective voltage levels of the voltages applied to the shared bit line 20, and applied to the independent write and read word lines 30, 40, programming, erase, write, and read operations of the memory units 102A, 102B of each of the memory cells 104 can be performed, as will be described in detail below.

In the dual-bit configuration shown, a memory cell 104 includes first and second memory units 102A, 102B, each of which can be programmed simultaneously. For example, by applying suitable voltage levels to the independently operated and controlled write word lines 30A, 30B, and by applying suitable voltage levels to the independently operated and controlled read word lines 40A, 40B, the states of the first and second memory units 102A, 102B can be programmed at the same time to be the same, for example both can be programmed to a "1" state or to a "0" state, or to be different, for example one having a "1" state and the other having a "0" state. Because the first and second memory units 102A, 102B share a common bit line 20, a read operation of their respective states cannot be performed simultaneously, but rather, must be programmed sequentially, since only one of the first and second memory units 102A, 102B can occupy the common bit line 20 at any given time. In this manner, dual bits can be programmed in each memory cell 104, one bit of information for each memory unit 104.

Figure 3B:
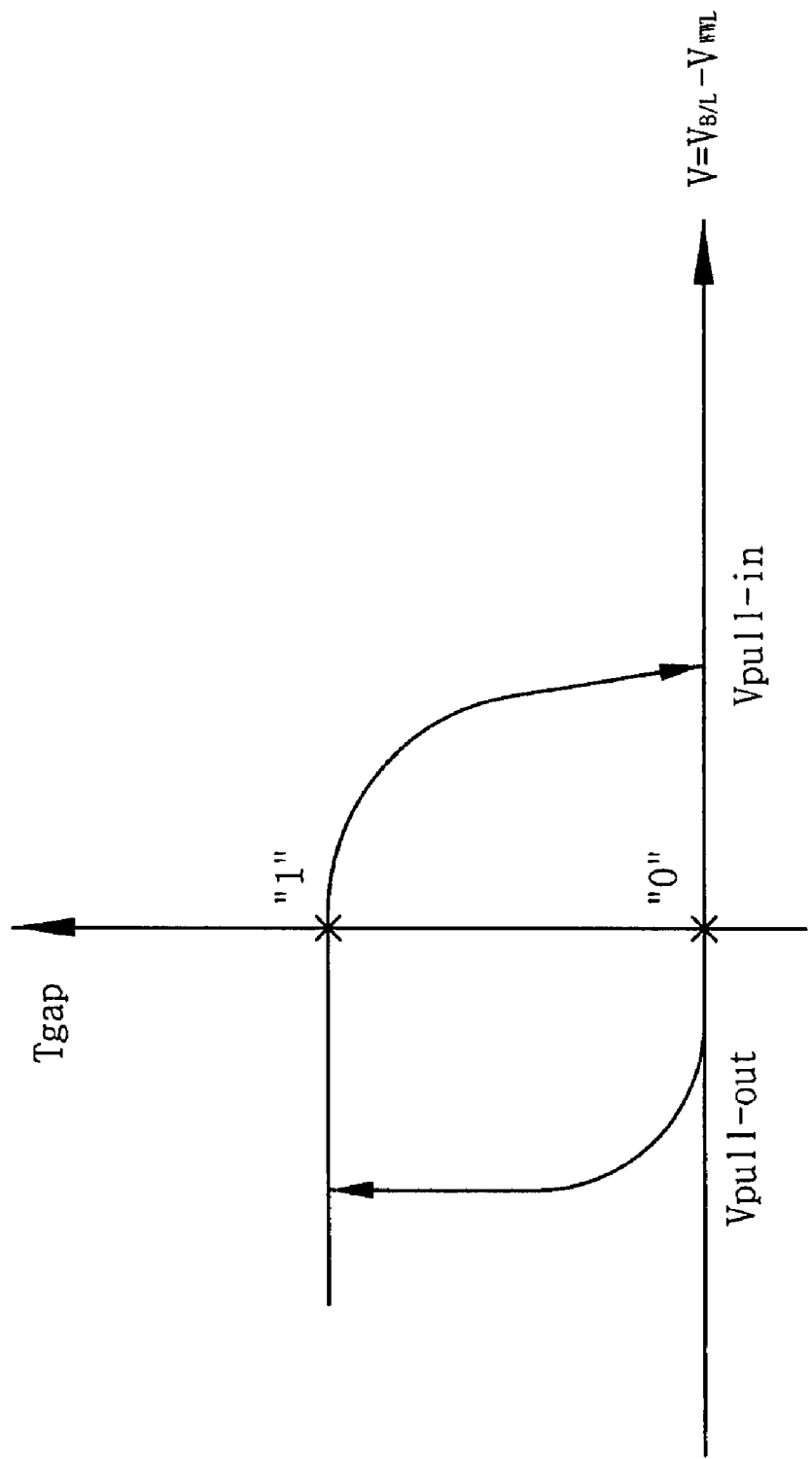
FIG. 3B is a graph of the state of the electrode as a function of the applied voltage difference between voltage levels applied to the bit line $V_{BL}$ and the write word line $V_{WWL}$.

FIG. 3A is an example chart of applied voltages for performing programming, write, erase and read operations of the unit memory cell embodiment of FIGS. 2A and 2B. FIG. 3B is a graph of the state of the electrode as a function of the applied voltage difference between voltage levels applied to the bit line $V_{BL}$ and the write word line $V_{WWL}$.

Figure 5A:
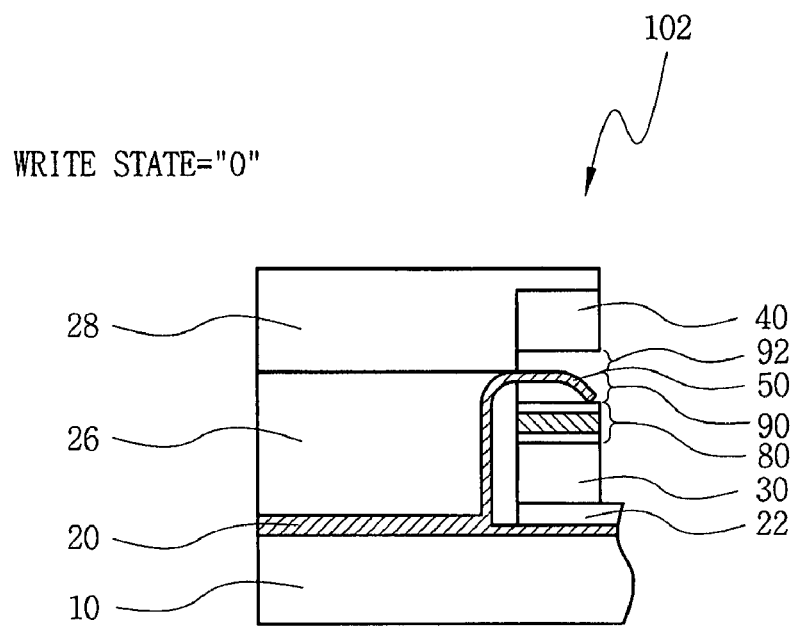
FIGS. 5A and 5B are sectional views of a memory unit in a second state and a read operation of the memory unit in the second state, for the non-volatile memory device embodiment of FIGS. 2A and 2B.

With reference to FIG. 3A, in the case of the writing of a "0" state, the selected one of the first and second electrodes 50A, 50B, is placed in a position of contact with the charge trapping structure 80A, 80B of the corresponding selected write word lines 30A, 30B. This state is shown in FIG. 5A, which is described below. To enable this, the voltage differential between the selected bit line $V_{sel\_BL}$ and the selected write word line $V_{sel\_WWL}$ is made to be a positive value. For example, $V_{sel\_BL}=2V$ and $V_{sel\_WWL}=-2V$. Other lines, including the selected read word line 40, and the unselected bit lines and read and write word lines are placed in a ground or floating state. The threshold voltage of the pull-in state is 4 volts in this example, where "pull-in" refers to a position of the electrode whereby by the electrode is in contact with the write word line or corresponding charge trapping structure.

Figure 4A:
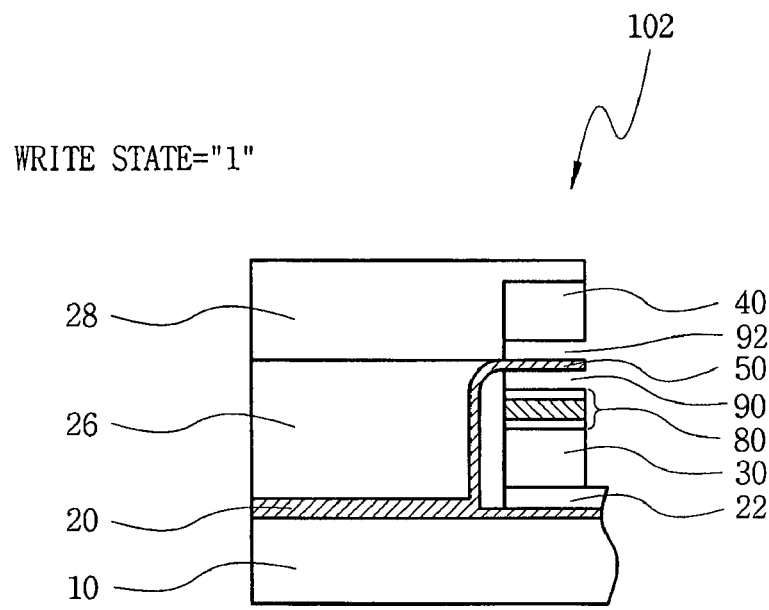
FIGS. 4A and 4B are sectional views of a memory unit in a first state and a read operation of the memory unit in the first state, for the non-volatile memory device embodiment of FIGS. 2A and 2B.

In the case of the writing of a "1" state, the selected one of the first and second electrodes 50A, 50B, is placed in a position of suspension in the gaps 90, 92 between the underlying charge trapping structure 80A, 80B of the selected write word lines 30A, 30B and the read word lines 40A, 40B. This state is shown in FIG. 4A, which is described below. To enable this, the voltage differential between the selected bit line $V_{sel\_BL}$ and the selected write word line $V_{sel\_WWL}$ is made to be a small positive, or small negative, value. For example, $V_{sel\_BL}=-2V$ and $V_{sel\_WWL}=0V$. Other lines, including the selected read word line 40, and the unselected bit lines and read and write word lines are placed in a ground or floating state. In this case, the direction of the applied electrostatic force is in an upward direction from the selected write word line $V_{sel\_WWL}$ 30A, 30B to the first and second electrodes 50A, 50B connected to the selected bit line $V_{sel\_BL}$, which restores the electrode 50A, 50B from its former position, which can include a position in contact with the underlying charge trapping structure 80A, 80B, to a state of suspension in the gaps 90, 92 between the underlying charge trapping structure 80A, 80B of the selected write word lines 30A, 30B and the read word lines 40A, 40B. The restoring force of the applied electrostatic force thus overcomes the electrostatic force, or Coulomb force, between the electrode 50A, 50B coupled to the selected bit line and the charge trapping structure 80A, 80B of the selected write word line 30A, 30B.

In the case of a programming operation, all memory units are placed in a state of "0", that is, all electrodes 50 in the device are placed in a position of contact with the charge trapping structure 80 of the corresponding write word lines 30. To enable this, the voltage differential between the bit lines $V_{B/L}$ and all write word lines $V_{WWL}$ is made to be a large positive value. For example, $V_{BL}$=~10V and $V_{WWL}$=~−10V. In this manner, the applied electrostatic force causes the electrodes 50 to come in contact with the charge trapping structure 80 of the corresponding write word lines 30, and since electrons are trapped in the charge trapping layers of the charge trapping structures, the electrodes 50 are retained in the bent position by the attractive force between the electrodes 50 and the charge trapping structures 80. Referring to the chart of FIG. 3A, in this example, during the programming operation, the voltage of the bit line $V_{BL}$ is set to a large positive value, represented by "++", the voltage of the write word line $V_{WWL}$ is set to a large negative value, represented by "−−", and the voltage of the read word line $V_{RWL}$ is set to an intermediate value, such as a ground voltage GND.

In the case of an erase operation, all memory units are placed in a state of "0", that is, all electrodes 50 in the device are placed in a position of contact with the charge trapping structures 80 of the corresponding write word lines 30. To enable this, the voltage differential between all write word lines $V_{WWL}$ and the bit lines $V_{BL}$ is made to be a negative value. For example, $V_{BL}$=GND, $V_{RWL}$=GND and $V_{WWL}$="−", where "−" represents a moderate negative voltage. In this manner, the applied electrostatic force causes the electrodes 50 to come into contact with the charge trapping structures 80 of the corresponding write word lines 30. The applied electrostatic force in this example is in an downward direction.

Thus, the programming and erase operations both result in the memory units being placed in the "0" state. The difference between the operations lies in the biasing level. In the programming operation, a large bias is applied to cause energy-band bending, and therefore Fower-Nordheim tunneling, to occur in the charge trapping structure 80, thereby trapping electrons in the charge trapping structure 80. In the erase operation, the applied bias is insufficient to cause energy band bending, which means that formerly trapped electrons do not flow from the charge trapping structure 80.

In the case of a read operation, the selected read word line 40A, 40B is biased with a moderate negative voltage "−", $V_{sel\_RWL}$, for example of −4V, while the other lines, including the selected write word line 30, the selected bit line 20 and the unselected bit lines and read and write word lines are placed in a ground state. This results in a voltage difference between the selected read word line 40A, 40B and the electrode 50A, 50B of the selected bit line 20 to be a positive value; thus the direction of the applied electrostatic force is in an upward direction, from the electrode 50 to the read word line 40, which results in movement of the electrode 50 in an upward direction toward the read word line 40, depending on the previous state of the gap between the electrode 50 and the read word line 40. If the electrode 50 was previously in a data "0" state, that is, in a state of contact with the underlying charge trapping layer 80 of the underlying write word line 30, then the gap between the electrode 50 and the read word line 40 is relatively large. Thus, the applied electrostatic force between the electrode 50 and the read word line 40 combined with the restoring force of the electrode is insufficient for overcoming the attractive Coulomb force between the electrode 50 and the charge trapping layer 80 of the underlying write word line 30. The electrode 50 therefore remains in a downward-bent position during the read operation, as shown in FIG. 5B, and no current is sensed, resulting in a determination that the read data element is of value "0". On the other hand, if the electrode 50 was previously in a data "1" state, that is in a state of suspension in the gap between the underlying charge trapping layer 80 of the underlying write word line 30 and the read word line, then the gap 92 between the electrode 50 and the read word line 40 is relatively small. Thus, the applied electrostatic force between the electrode 50 and the read word line 40 is sufficient for placing the electrode 50 in contact with the read word line 40. The electrode 50 is thereby placed in an upward-bent position during the read operation, as shown in FIG. 4B, and current flow is sensed, resulting in a determination that the read operation read data element is of value "1".

FIG. 3B is a graph of the state of the electrode as a function of the applied voltage difference between voltage levels applied to the bit line $V_{BL}$ and the write word line $V_{WWL}$. When the voltage difference $V_{BL}$−$V_{WWL}$ is positive by a sufficient amount, the electrode moves to deflect in a downward direction, and thus the gap Tgap between the electrode and the write word line becomes zero. The applied voltage that is sufficient to cause this action is referred to in FIG. 3B as the "pull-in" voltage or Vpull-in. In contrast, when the voltage difference $V_{BL}$−$V_{WWL}$ is negative by a sufficient amount, the electrode moves to deflect in an upward direction, and thus the gap Tgap between the electrode and the write word line is present. The applied voltage that is sufficient to cause this action is referred to in FIG. 3B as the "pull-out" voltage or Vpull-out. In the graph of FIG. 3B, Vpull-in=$V_{BL}$−$V_{WWL}$>0, while Vpull-out=$V_{BL}$−$V_{WWL}$<0. Note that this chart applies to the non-volatile device example, including the charge trapping structure 80. Absent the charge trapping structure 80, for example, in the volatile device embodiment discussed in FIGS. 16-18 below, Vpull-out will lie at zero voltage or at a small, positive voltage.

In each state of "0" and "1", a Coulomb (or capacitive) force is present between oppositely biased electrodes, and a recovery force, or restoring force, is present in the electrode's 50 natural propensity to restore itself to the rest position. This recovery force is related to the Young's modulus of the bit line material, among other factors.

Figure 4B:
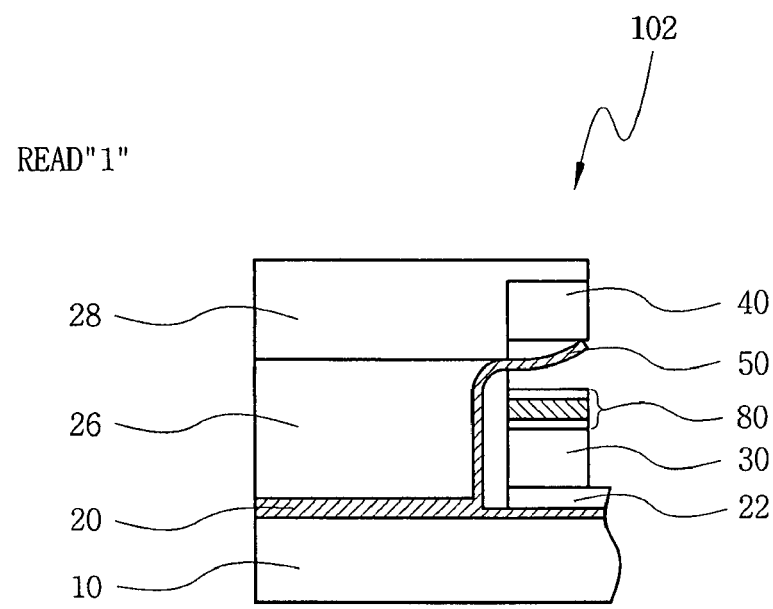
Figure 5B:
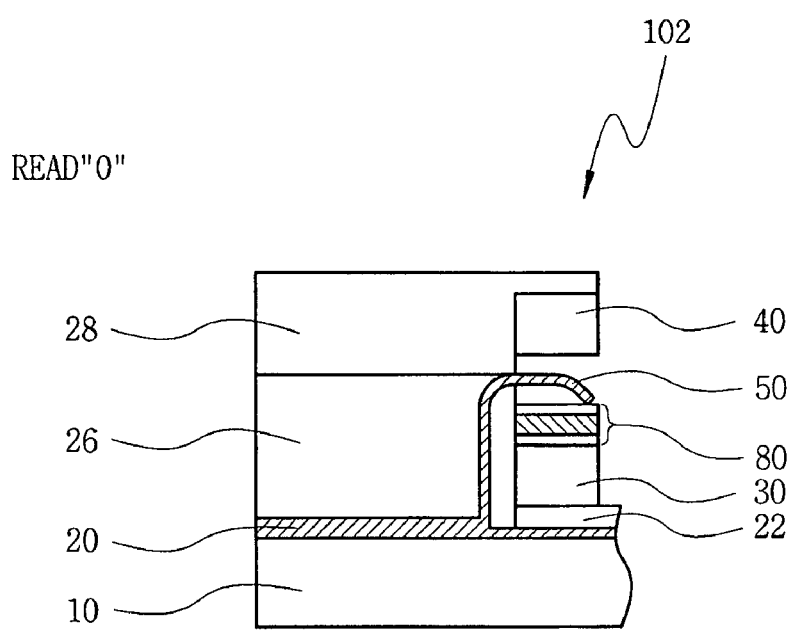

FIGS. 4A and 4B are sectional views of a memory unit 102 of a memory cell 104 in a first state and a read operation of the memory unit 102 in the first state, for the non-volatile memory device embodiment of FIG. 2B.

Referring to FIG. 4A, as a result of a write operation, the electrode 50 is in a rest position, that is, in a suspended position between the charge trapping structure 80 and the read word line 40, and not engaging either the charge trapping structure 80 or the read word line 40. To reach this state, absent the strong biasing voltage between the electrode 50 and the write word line 30, the restoring force of the electrode 50 operates to overcome the Coulomb force between the electrode 50 and the write word line 30. Accordingly, the electrode 50 is in the rest position. In one embodiment, this position of the electrode corresponds with a "1" binary state for the memory unit 102; however, in another embodiment, the electrode 50 being in such a rest position could equally be considered to correspond with a "0" binary state for the memory unit 102.

In the state of "1" as shown in FIG. 4A, the electrode 50 is positioned at a suitable gap distance from the read word line 40 and remains in that position indefinitely, in a non-volatile manner, until a subsequent erase, write, or programming operation occurs, or until a read operation occurs, even with removal of applied power to the device, which removes any voltage applied to the write word lines 30. During a subsequent read operation of the memory unit 104, a voltage potential is applied between the read word line 40 and the bit line 20 that is sufficient in magnitude to cause the distal end 53 of the electrode 50 to deflect from the rest position of FIG. 4A to an engaged position as shown in FIG. 4B, whereby the electrode 50 is bent in an upward direction through the upper gap 92 and such that the distal end 53 of the electrode 50 makes contact with a lower surface of the read word line 40. The suspended electrode 50 is pulled in an upward direction toward the read word line 40 by the present attractive Coulomb force between the electrode 50 and the read word line 40, until they are engaged. In this engaged position, a current is generated between the read word line 40 and the bit line 20 that passes through the electrode 50. That current is sensed by current sensing circuitry connected to the read word lines 40 of the device, which results in the read operation indicating a reading of a "1" state for the memory unit 102.

FIGS. 5A and 5B are sectional views of a memory unit 102 of a memory cell 104 in a second state and a read operation of the memory unit 102 in the second state, for the non-volatile memory device embodiment of FIG. 2B.

Referring to FIG. 5A, as a result of a write operation, the electrode 50 is in an engaged position, whereby the electrode 50 is bent in a downward direction and the distal end 53 of the electrode 50 makes contact with an upper surface of the charge trapping structure 80. To reach this state, when the electrode 50 is positively biased and the write word line 30 is negatively biased, such as during a programming or erase operation, the electrode 50 is bent in the downward direction to contact the underlying charge trapping structure 80 because the Coulomb force present as a result of the bias overcomes the restoring force of the electrode 50. When the bias is later removed, for example, when power is removed from the device, the electrode 50 remains in the bent position, because the Coulomb force is maintained by the electrons trapped in the charge trapping structure 80. In one embodiment, this position of the electrode corresponds with a "0" binary state for the memory unit 102; however, in another embodiment, the electrode 50 being in such a bent position could equally be considered to correspond with a "1" binary state for the memory unit 102.

In the state of "0" as shown in FIG. 5A, the electrode 50 is bent so that its distal end 53 makes contact with an upper surface of the charge trapping structure 80 and remains in that position indefinitely, in a non-volatile manner, until a subsequent erase, write, or programming operation occurs. During a subsequent read operation of the memory unit 102, a voltage potential is applied between the read word line 40 and the bit line 20. A voltage potential for the read operation is selected that would have been sufficient in magnitude to cause the electrode 50 to deflect from the rest position of FIG. 4A to an engaged position with the lower surface of the read word line 40; however, the relatively small voltage potential applied between the read word line 40 and the bit line 20 for the read operation combined with the restoring force of the electrode 50 is not of sufficient magnitude so as to overcome the attractive Coulomb force between the charge trapping layer 80 and the electrode 50. As a result, during a read operation of the memory unit 102 in the state shown in FIG. 5A, the electrode 50 remains in the same position, that is, in an engaged position with an upper surface of the charge trapping structure 80. Thus, during the read operation, when the read operation voltage potential is applied to the read word line 40 and the bit line 20, no current is generated between the read word line 40 and the bit line 20, because the electrode 50 in the downward-bent position does not operate to close the current path between the read word line 40 and the bit line 20. The lack of current, as detected by the corresponding current sensing circuitry, results in the read operation indicating a reading of a "0" state for the memory unit 102.

Upon initial programming of the device, the high-bias condition provides the charge trapping structures 80 with tunneling of electrons, through Fower-Nordheim tunneling. No further programming is required since the trapped electrons permanently occupy the charge trapping structure 80; thus, no further high-bias operation is needed. Transition between the "1" and "0" states is achieved by moderate biasing of the write word line 30 and the electrode 50; a moderate bias level that does not result in further Fower-Nordheim tunneling. As a result, the device is operable at moderate power levels, leading to high energy efficiency.

To ensure accurate and reliable programming, writing, erase and reading operations in a device, the elasticity of the electrode 50, the width of the lower and upper gaps 90, 92 and the magnitude and polarity of the applied voltages are considered. For example, the elasticity of the electrode 50 is dependent at least in part, on the length, the thickness, and the material properties of the electrode 50. The upper and lower gap widths or distances affect on the amount of travel of the electrode between a position of engagement with the read word line 40, a rest position, and a position of engagement with the charge trapping structure 80. The gap distances affect the voltage levels that are required for moving the electrode between its various engaging and rest positions. The upper and lower gap distances can be the same, or different, depending on the application. Elasticity of the electrode material affects the resilience of the electrode, and its propensity to return to the rest position, as well as the lifespan of the electrode over many cycles of write and read operations. In addition, the cantilevered electrode configuration leads to reduced operating voltage owing to its increased flexibility, since only one end is fixed and the other is freely movable. Tradeoffs between each of these factors, and other factors, will contribute to the operating speed, operating voltages, and reliability of the resulting device.

FIGS. 6A-15A are perspective views of a method for forming a multiple-bit electromechanical non-volatile memory device in accordance with an embodiment of the present invention. FIGS. 6B-15B are sectional views taken along section lines I-I' of FIGS. 6A-15A respectively.

Figure 6A:
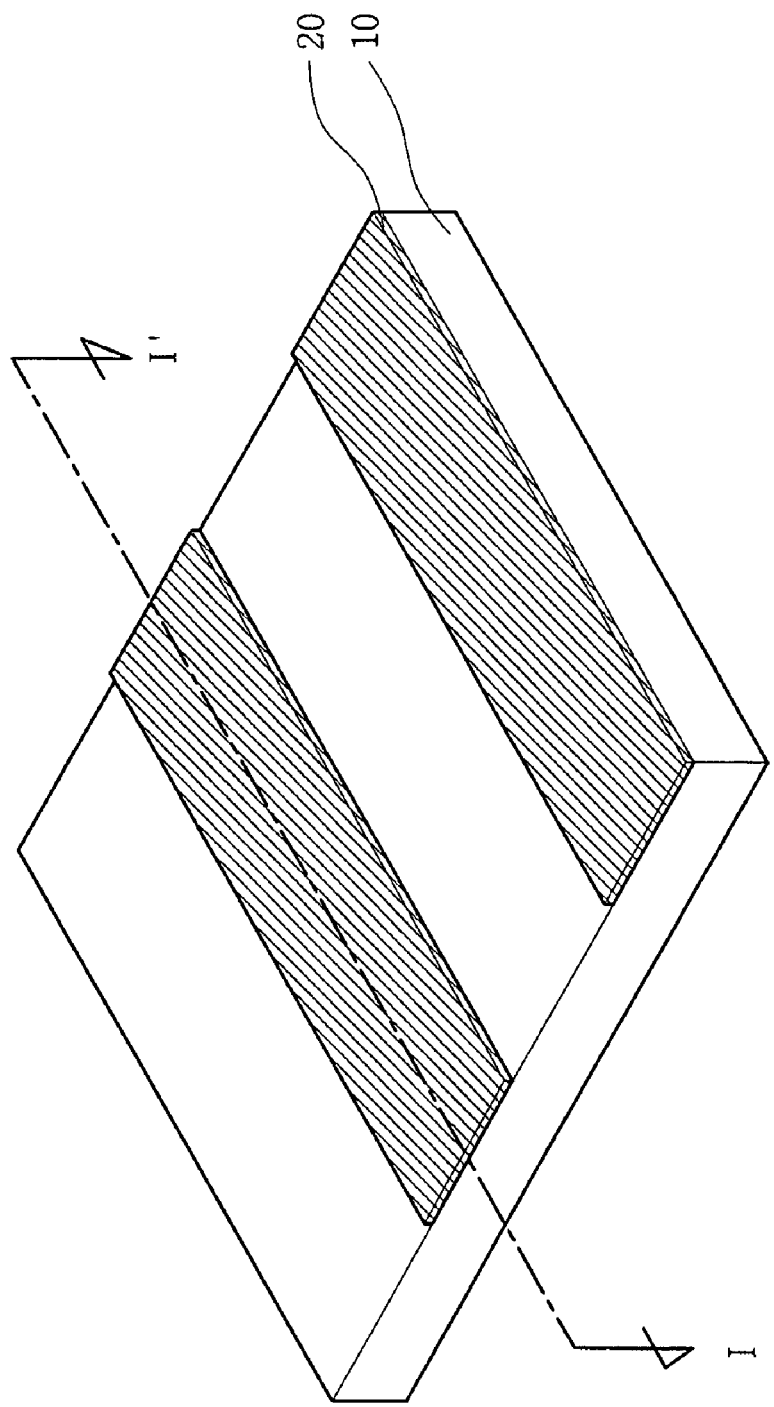
Figure 6B:
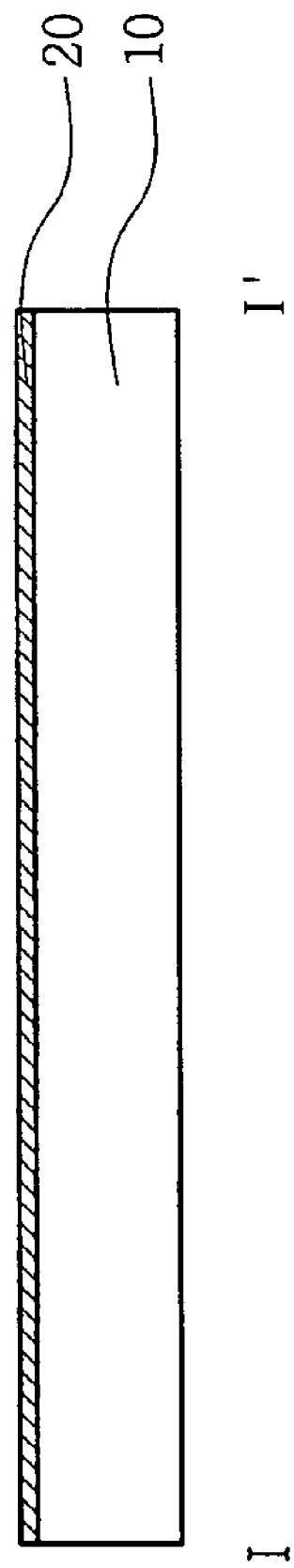

Referring to FIGS. 6A and 6B, a bit line layer is provided on a substrate 10 and patterned to form a plurality of bit lines 20 on the substrate 10. The bit lines 20 extend in a first direction on the substrate and are separated from each other in the second direction. The substrate 10 can comprise, for example, a semiconductor material, such as bulk silicon. Alternatively, the substrate 10 can comprise a silicon-on-insulator (SOI) structure or a flexible insulation layer that is applied to an underlying bulk structure for support. The bit line layer can comprise, for example, a conductive material such as gold, silver, copper, aluminum, tungsten, titanium nitride, or any other suitable conductive material that can be patterned to form the bit lines 20. In one embodiment, the bit line layer material comprises $WSi_2$, formed to a thickness of about 50 nm, using chemical vapor deposition (CVD).

Figure 7A:
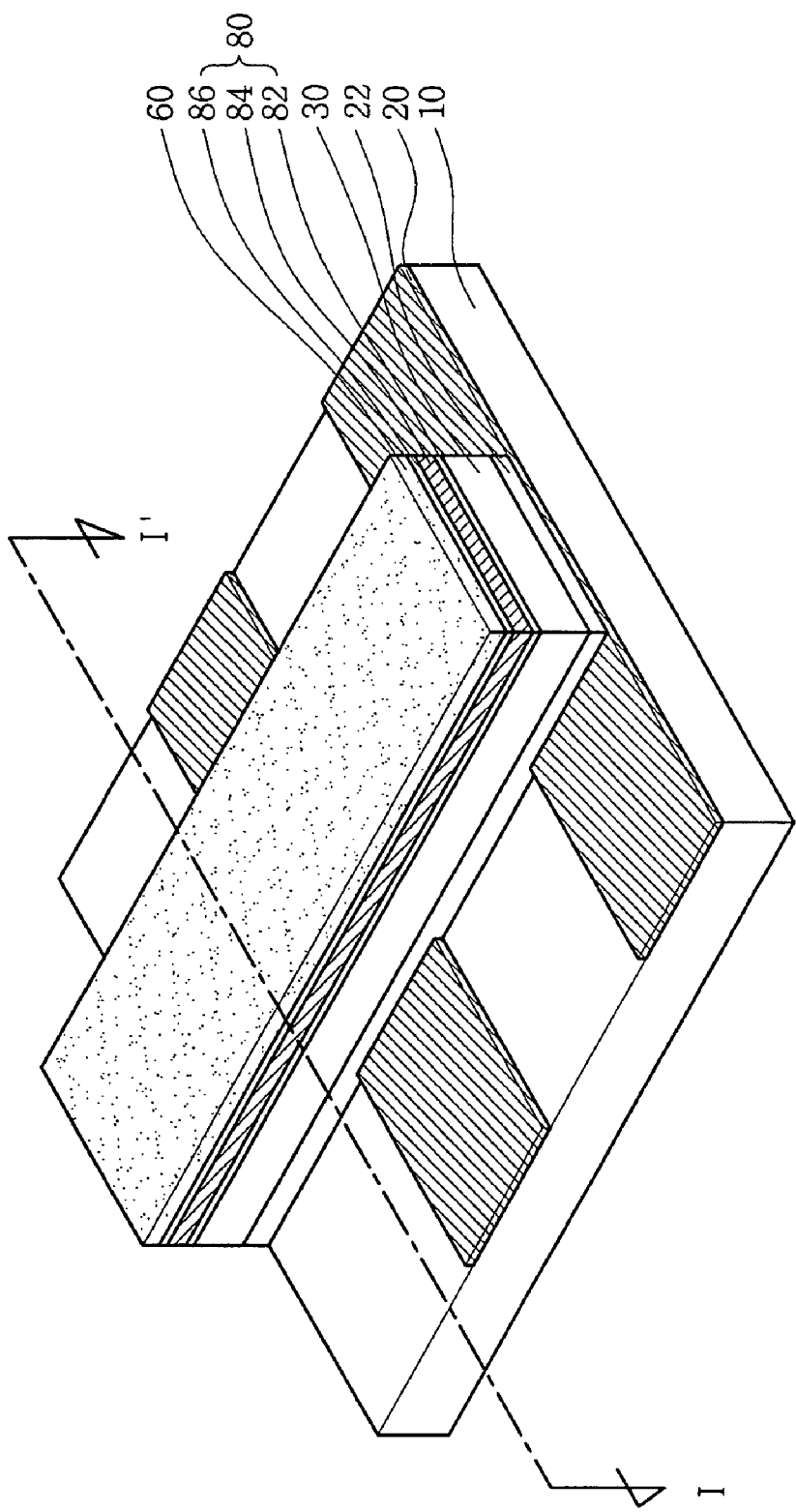
Figure 7B:
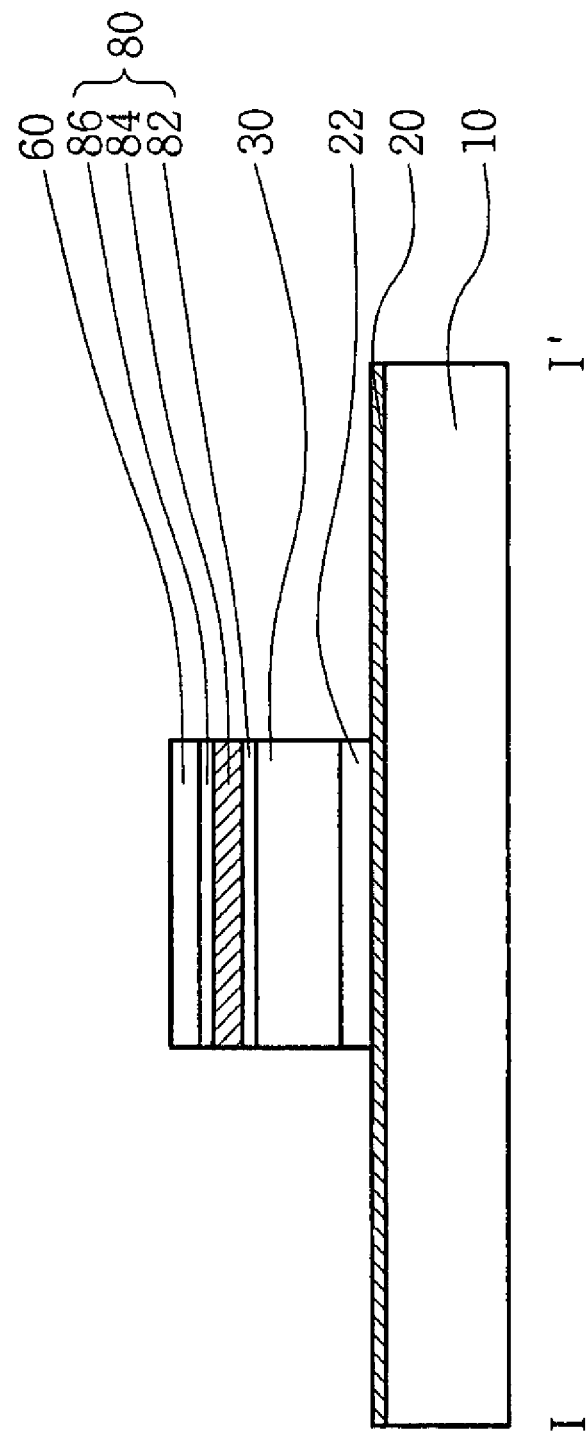

Referring to FIGS. 7A and 7B, a first interlayer dielectric layer, a write word line layer, a charge trapping layer and a first sacrificial layer are provided on the underlying substrate 10 and bit lines 20. The layers are selectively patterned using standard photolithographic techniques to form a patterned first interlayer dielectric layer 22, a patterned write word line 30, a patterned charge trapping structure 80 and a patterned first sacrificial layer 60. In one embodiment, the stated layers are patterned at the same time, using the same photomask. The resulting patterned write word line 30, patterned charge trapping layer 80 and patterned first sacrificial layer 60 structures extend on the substrate across the bit lines 20 in a second direction that is transverse the first direction of extension of the bit lines 20. In this embodiment, the patterned charge trapping structure 80 comprises a tunnel oxide layer 82, a charge trapping layer 84 for example comprising nitride, and a blocking oxide layer 86 to provide a multiple-layered oxide/nitride/oxide (ONO) charge trapping structure. Other suitable charge trapping structure materials such as oxide/nitride/alumina (ONA) are equally applicable to the devices and methods of formation of the embodiments of the present invention.

In this step, an optional transition layer can be present between the patterned write word line 30 and the patterned charge trapping structure 80. The optional transition layer can be applied to maintain suitable properties in the tunnel oxide layer 82.

In one embodiment, the first interlayer dielectric layer comprises silicon oxide formed to a thickness of about 100 nm; the write word line layer comprises $WSi_2$, formed to a thickness of about 50 nm using a CVD process; the charge trapping layer comprises oxide/nitride/oxide (ONO) layers formed to respective thicknesses of about 10 nm/20 nm/10 nm; and the first sacrificial layer comprises doped polysilicon or polysilicon formed to a thickness of about 50-150 angstroms using atomic layer deposition (ALD). In one embodiment, patterning of this structure is performed using an ARF hard mask formed of P-TEOS material, which is removed following patterning using an LAL etch process.

Figure 8A:
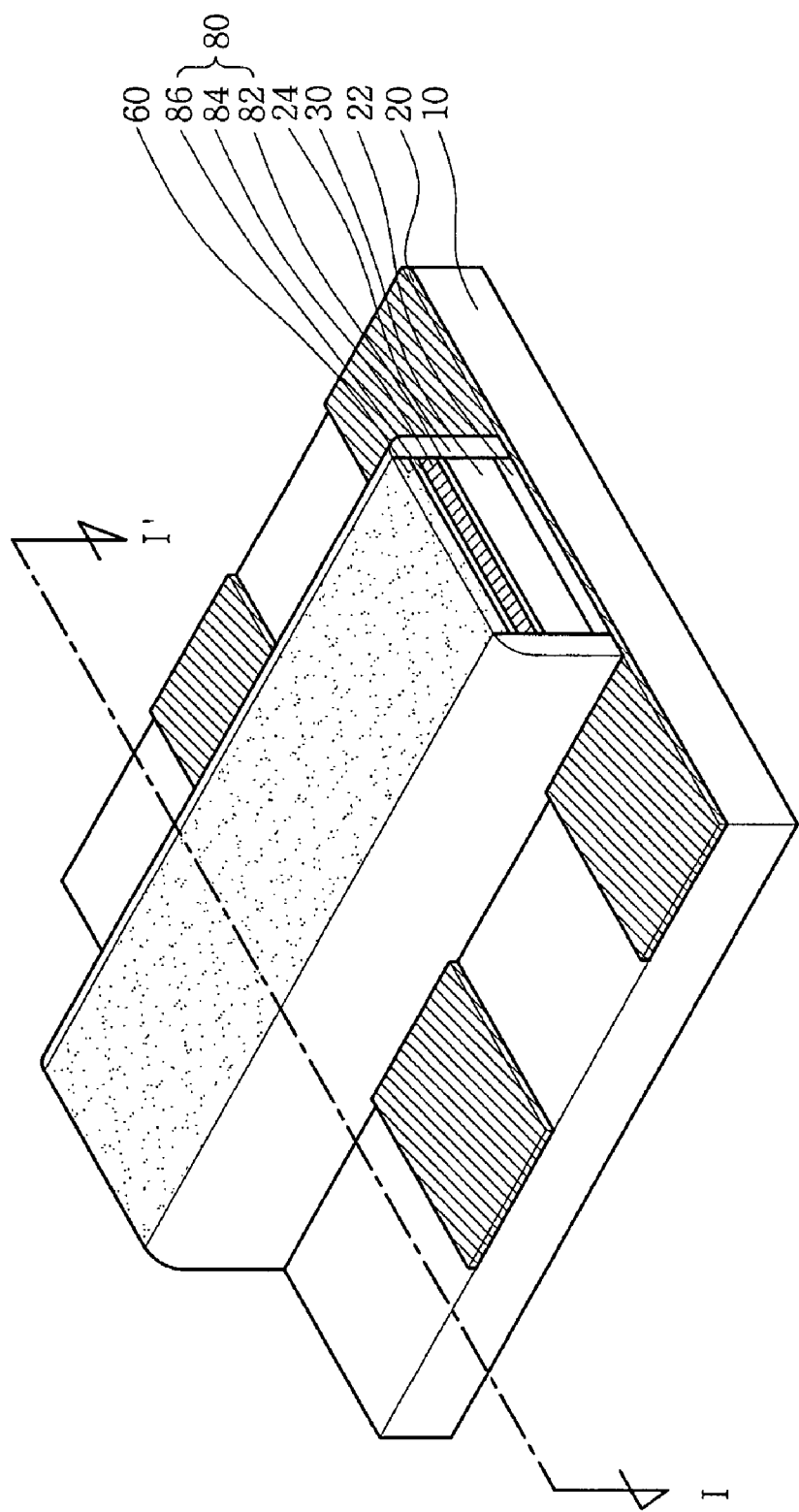
Figure 8B:
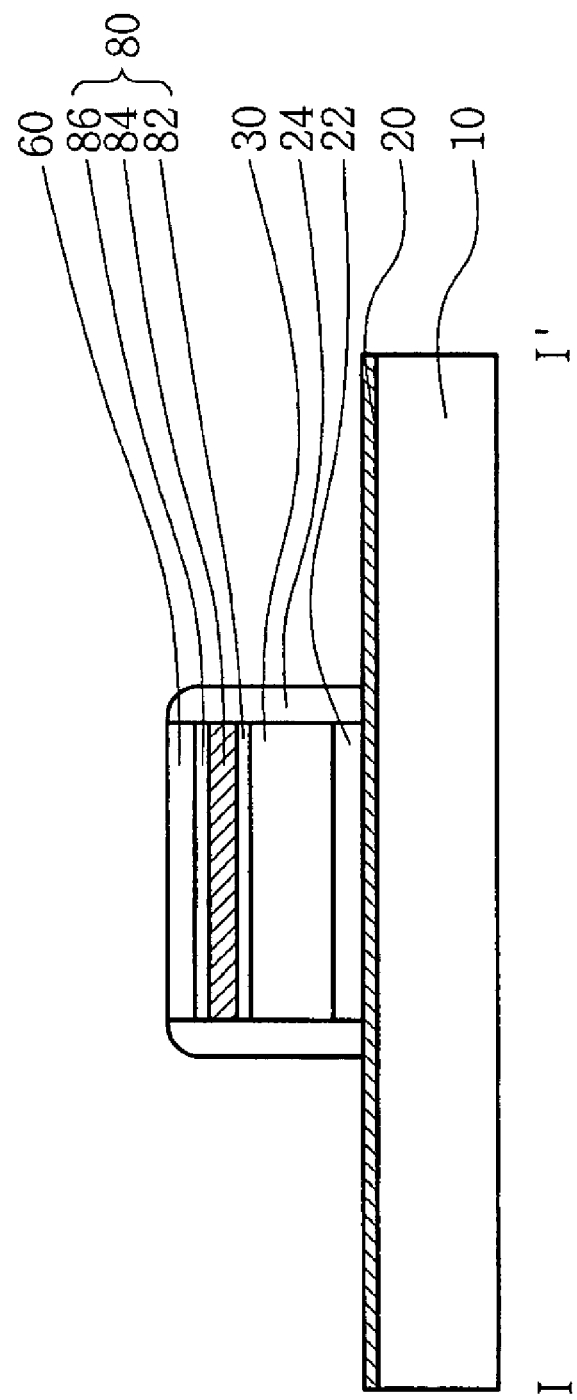

Referring to FIGS. 8A and 8B, insulative sidewall spacers 24 are formed on the resulting structure. This step can be accomplished, for example, by performing a chemical vapor deposition (CVD) of an insulative material, such as silicon oxide, and by performing an etch-back process to form the insulative sidewall spacers 24. In this embodiment, the insulative spacers extend along the outer sidewalls of the patterned first interlayer dielectric layer 22, the patterned write word line 30, the patterned charge trapping layer 80 and the patterned first sacrificial layer 60. In one embodiment, the sidewall spacers 24 are formed of a medium temperature oxide material formed to a thickness of about 30 nm.

Figure 9A:
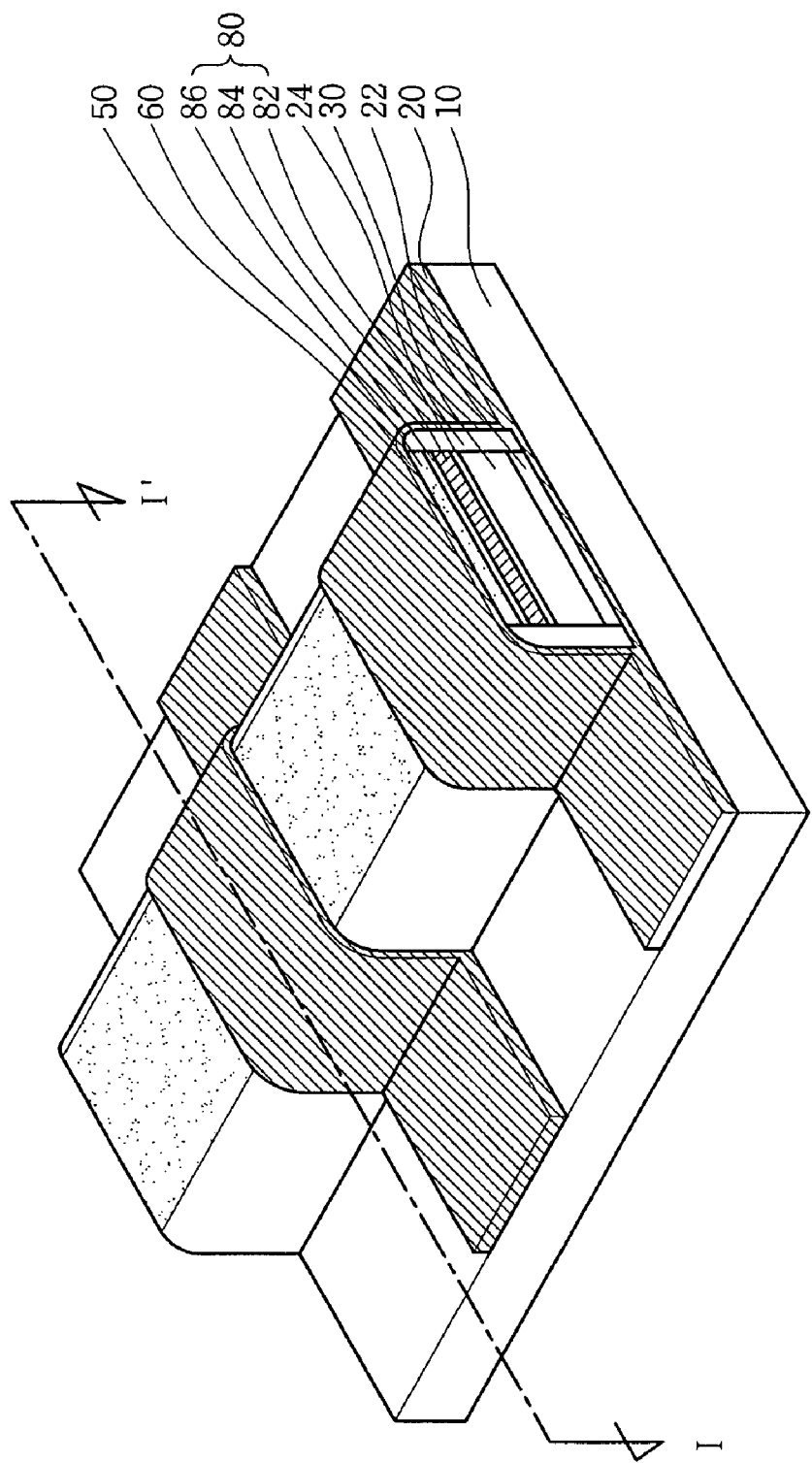

Referring to FIGS. 9A and 9B, an electrode layer is applied to the resulting structure and is patterned, for example using photolithographic techniques, to extend in the first direction, on the bit lines 20, along outer sidewalls of the sidewall spacers 24, and on the patterned first sacrificial layer 60. As a result, a patterned electrode layer 50 that lies on the outer sidewalls of the sidewall spacers 24 and on the patterned first sacrificial layer 60, and makes contact at first and second locations with the underlying bit line 20, is formed. The electrode layer used for forming the patterned electrode layer 50 can comprise, for example, a conductive material such as gold, silver, copper, aluminum, tungsten, titanium nitride, or any other suitable conductive material that can be subsequently patterned to form the electrodes 50A, 50B. In the embodiment shown, each portion of the patterned electrode layer 50 is of a width that is substantially the same as the width of the underlying bit line 20. In one embodiment, the electrode layer comprises TiN material, formed to a thickness ranging between about 5 nm and 30 nm, and, in one embodiment, 20 nm, and is patterned using a polysilicon hard mask that is removed following patterning.

Figure 10B:
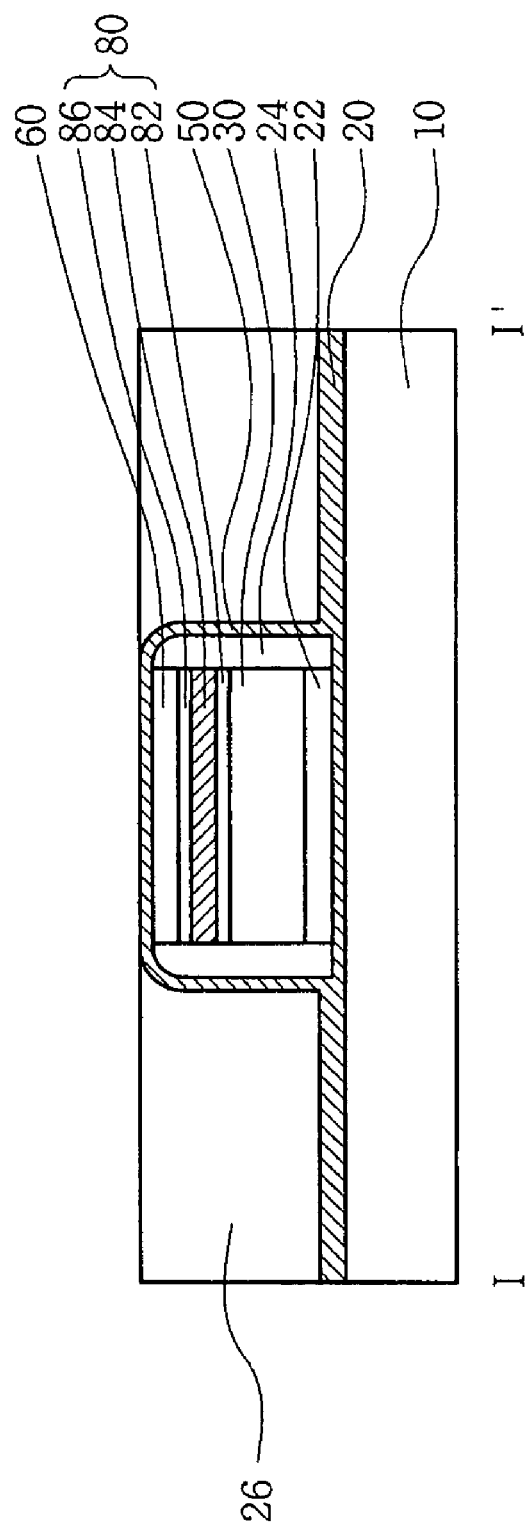

Referring to FIGS. 10A and 10B, a second interlayer dielectric layer 26 is applied to the resulting structure, for example using chemical vapor deposition (CVD) of an insulative material, such as silicon oxide, to cover the resulting structure. In one embodiment, chemical-mechanical polishing is then performed to remove an upper portion of the second interlayer dielectric layer 26 to expose an upper portion of the patterned electrode layer 50. In one embodiment, the second interlayer dielectric layer 26 comprises CVD oxide, formed to a thickness of about 150 nm.

Figure 11A:
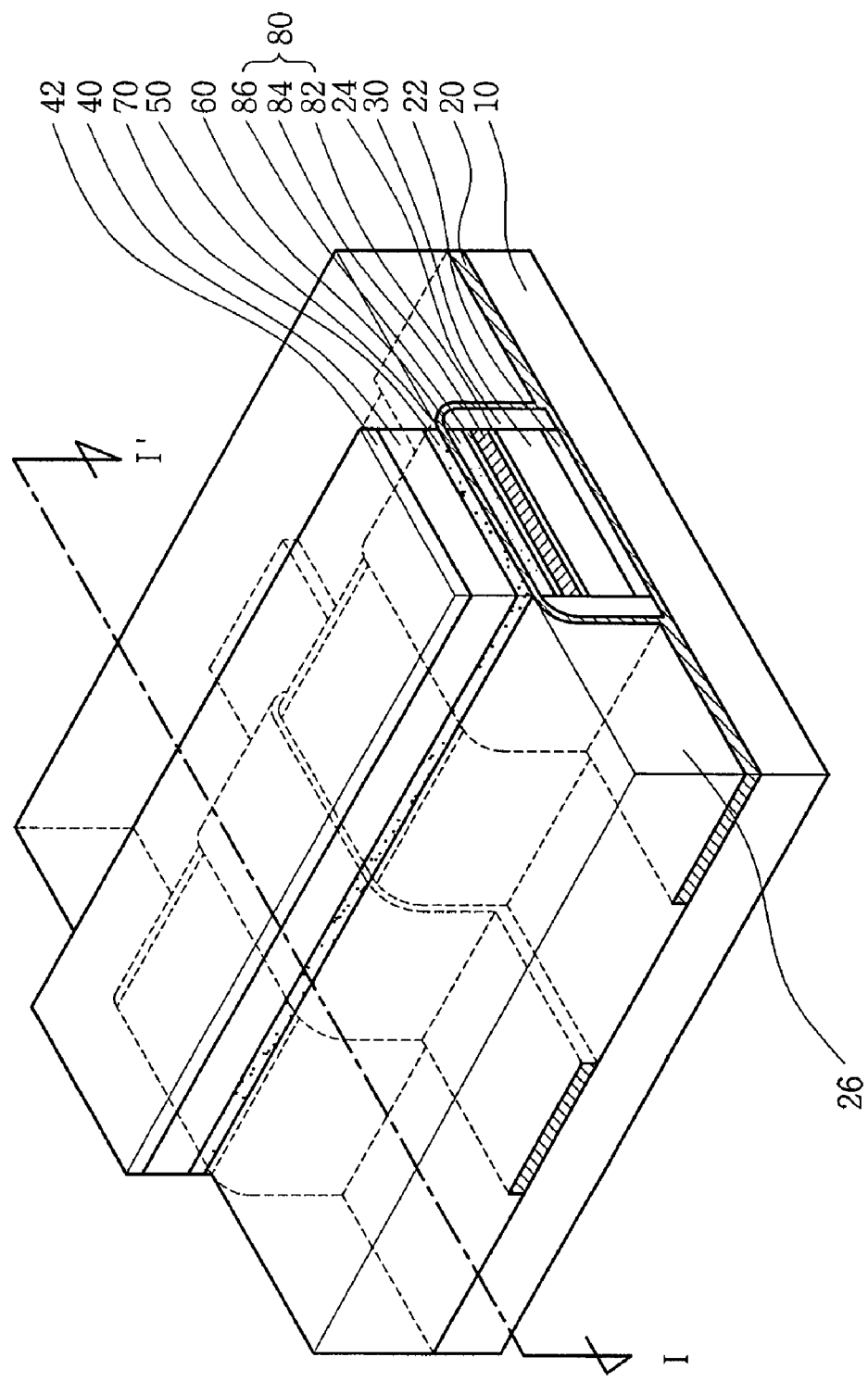
Figure 11B:
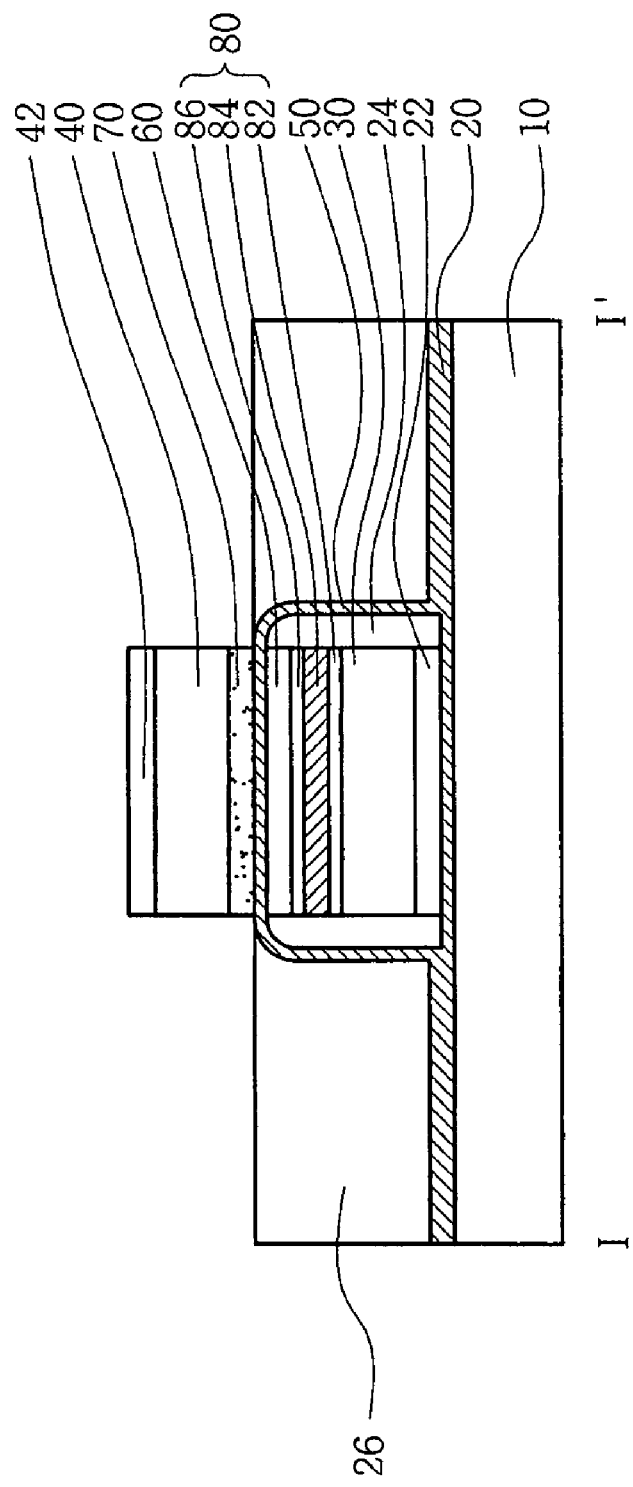

Referring to FIGS. 11A and 11B, a second sacrificial layer, a read word line layer, and a first hard mask layer are sequentially formed on the resulting structure. The layers are selectively patterned to form a patterned second sacrificial layer 70, a patterned read word line 40, and a patterned first hard mask layer 42, using standard photolithography techniques. In one embodiment, the stated layers are patterned at the same time, using the same photomask. The resulting patterned second sacrificial layer 70, a patterned read word line 40, and a patterned first hard mask layer 42 structures extend on the resulting structure in the second direction, and intersect the bit lines 20 and corresponding patterned electrode layers 50. In the embodiment shown, the patterned second sacrificial layer 70, the patterned read word line 40, and the patterned first hard mask layer 42 structures are each of a width that is substantially the same as the width of the underlying charge trapping structure 80 and patterned write word line 30 structures.

In one embodiment, the second sacrificial layer comprises doped a-silicon or polysilicon formed to a thickness ranging between about 5 nm and 30 nm, and in one embodiment, 20 nm using atomic layer deposition (ALD); the read word line layer comprises $WSi_2$, formed to a thickness of about 50 nm using a CVD process; and the first hard mask layer comprises silicon nitride, formed to a thickness of about 100 nm.

Figure 12A:
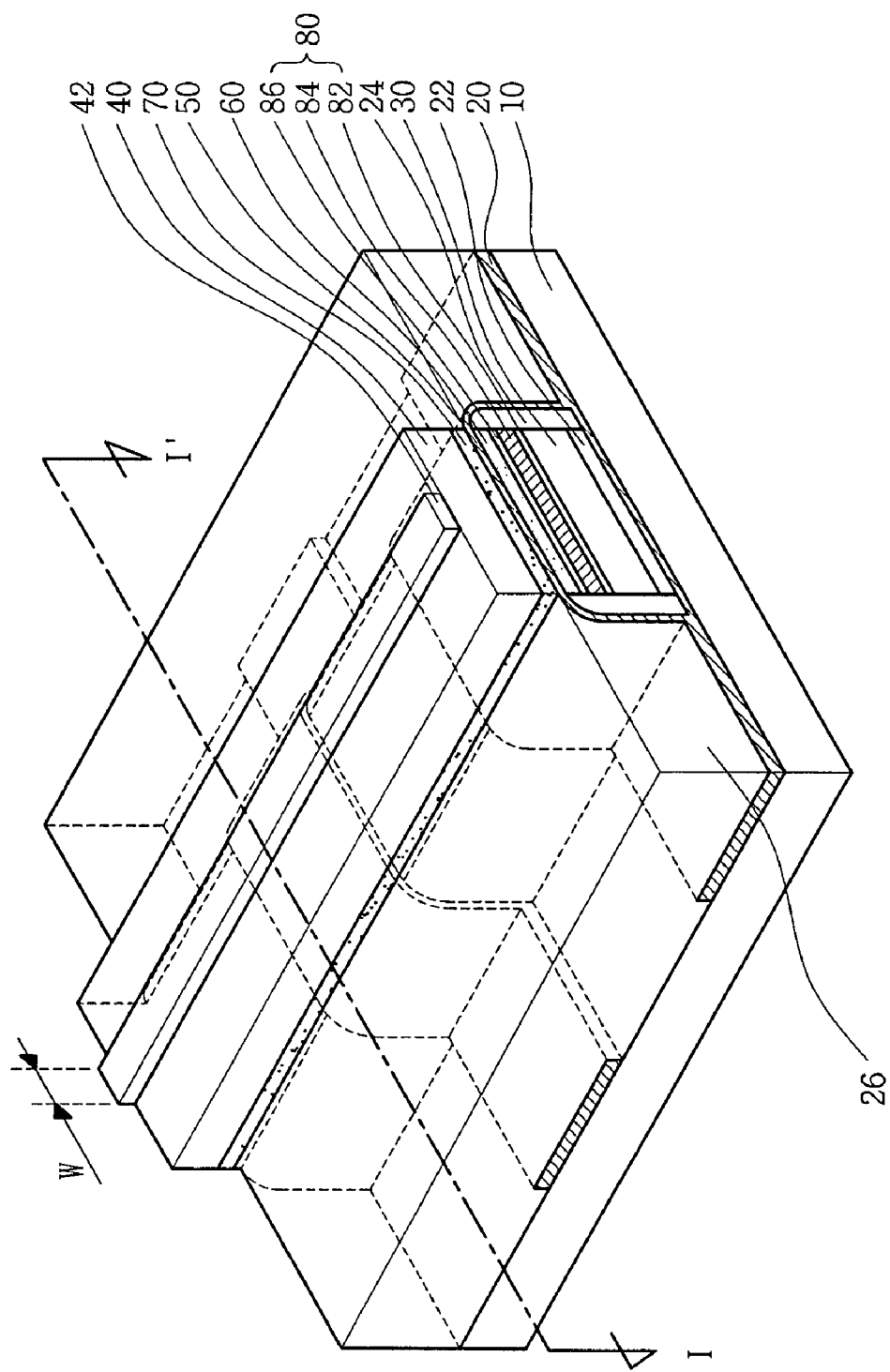
Figure 12B:
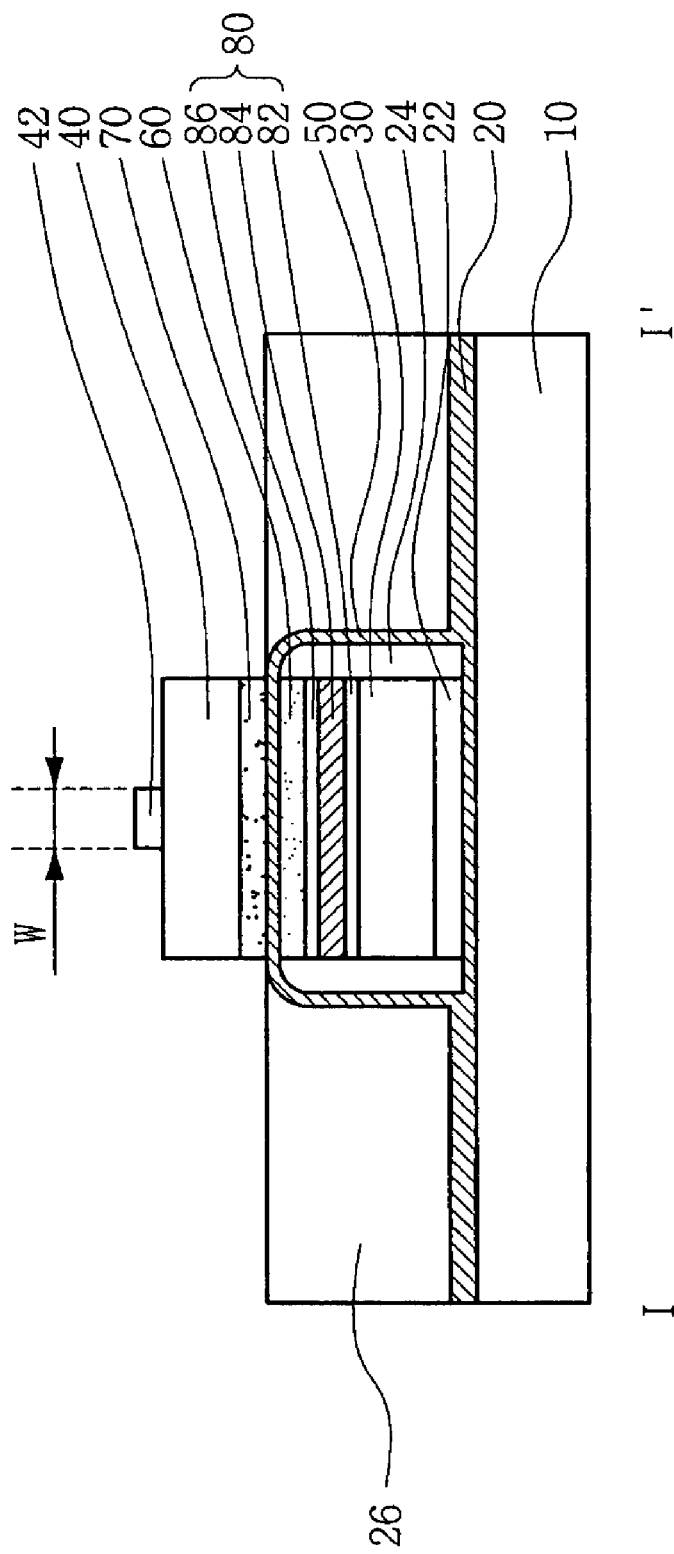

Referring to FIGS. 12A and 12B, a pull-back, or etch-back, process is performed to reduce the width of the patterned first hard mask layer 42. The resulting width w of the reduced-width first hard mask layer 42 will define the resulting width of the trench 100 that is to be formed between the first and second memory units 102A, 102B of the resulting unit cell 104.

Figure 13A:
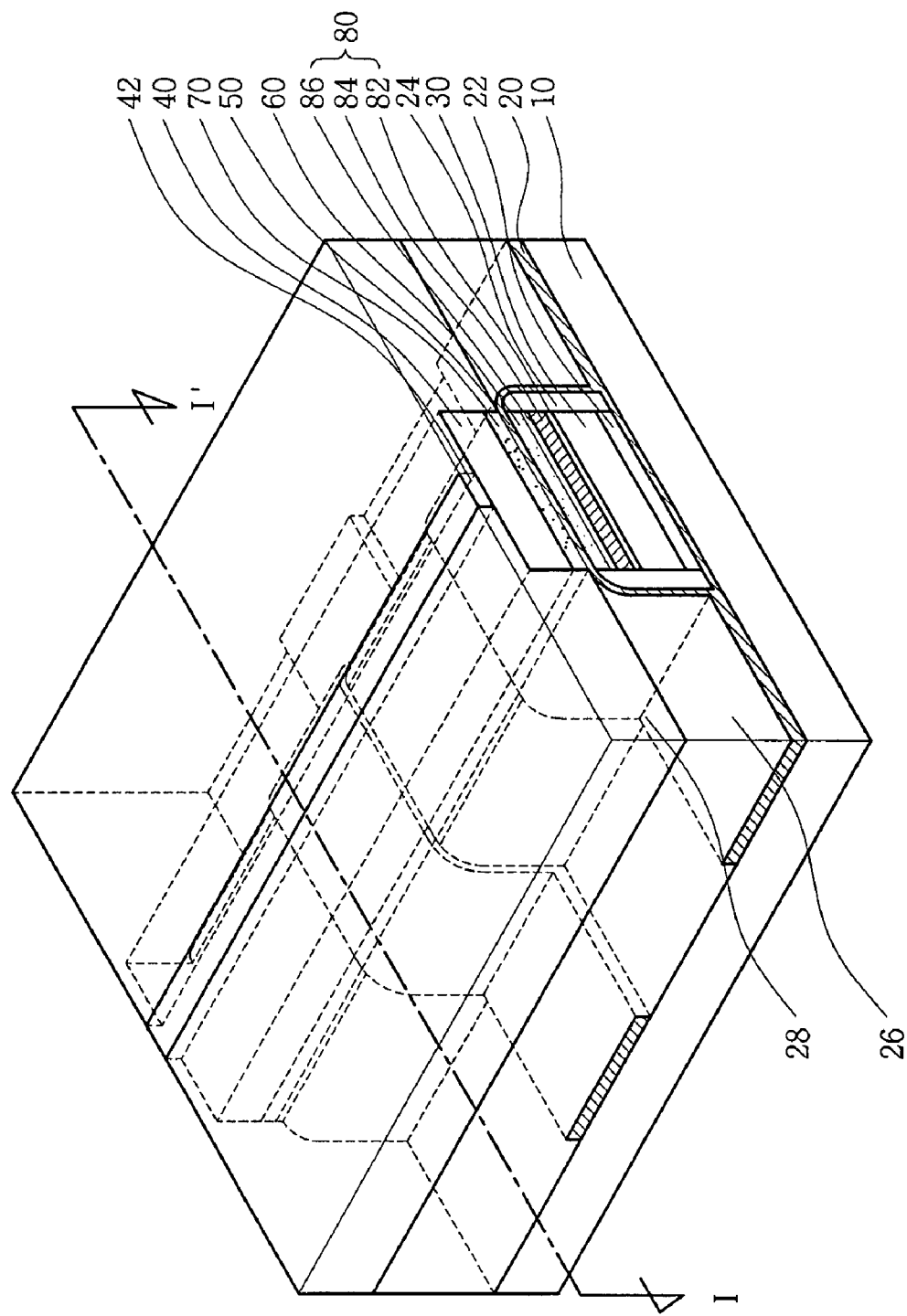
Figure 13B:
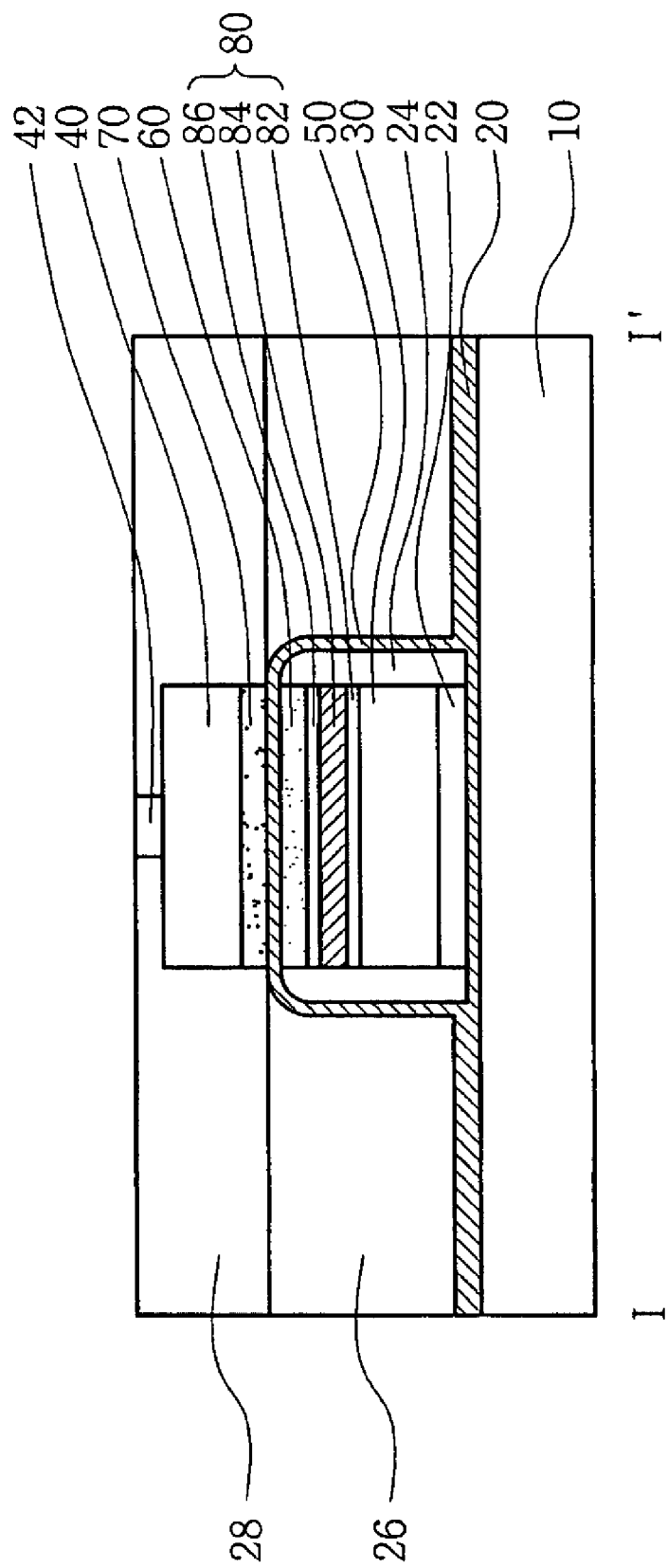

Referring to FIGS. 13A and 13B, a third interlayer dielectric layer 28 is applied to the resulting structure, for example using chemical vapor deposition (CVD) of an insulative material, such as silicon oxide, to cover the resulting structure. In one embodiment, chemical-mechanical polishing is then performed to remove an upper portion of the third interlayer dielectric layer 28 to expose an upper portion of the reduced-width first hard mask layer 42.

Figure 14A:
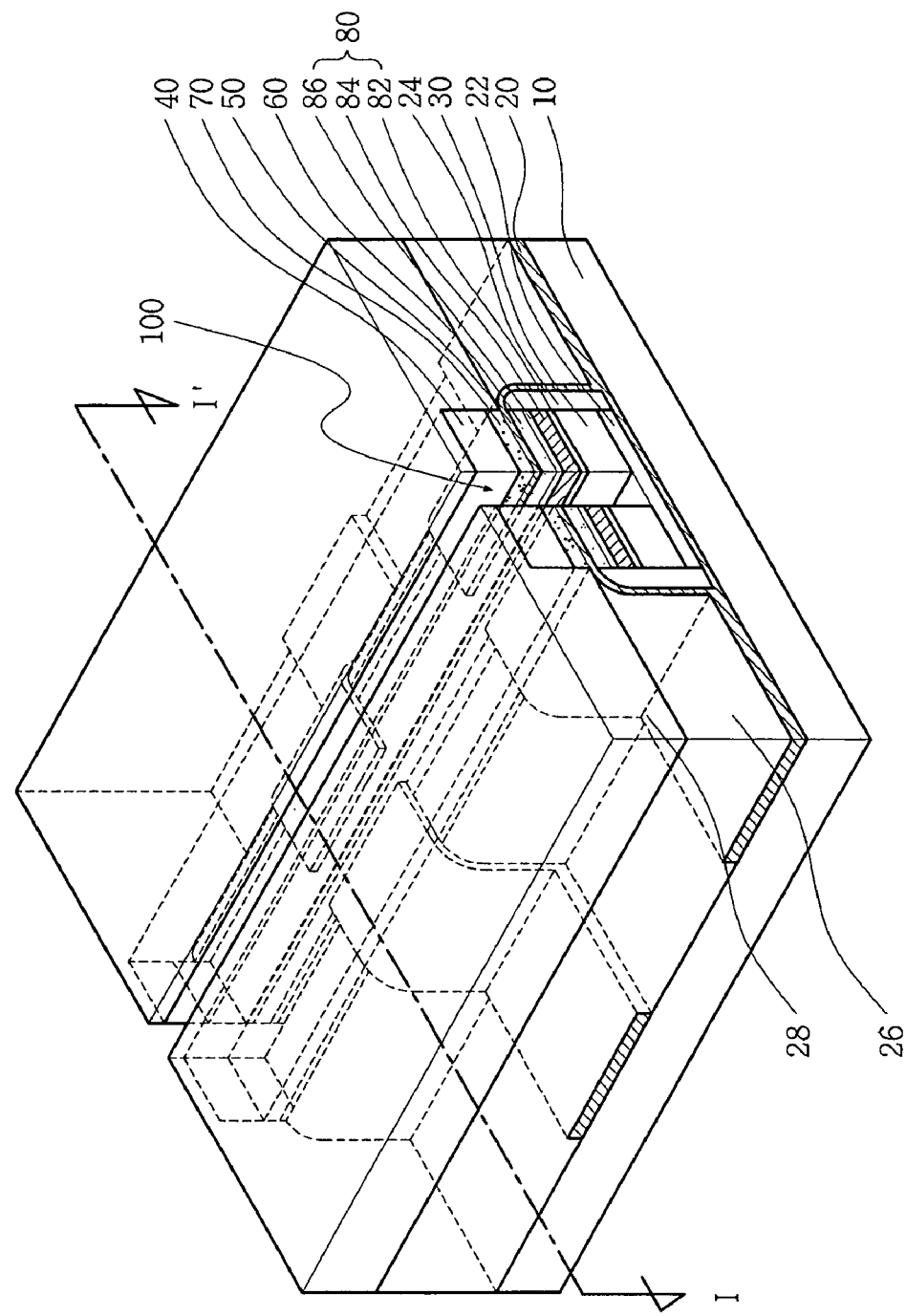
Figure 14B:
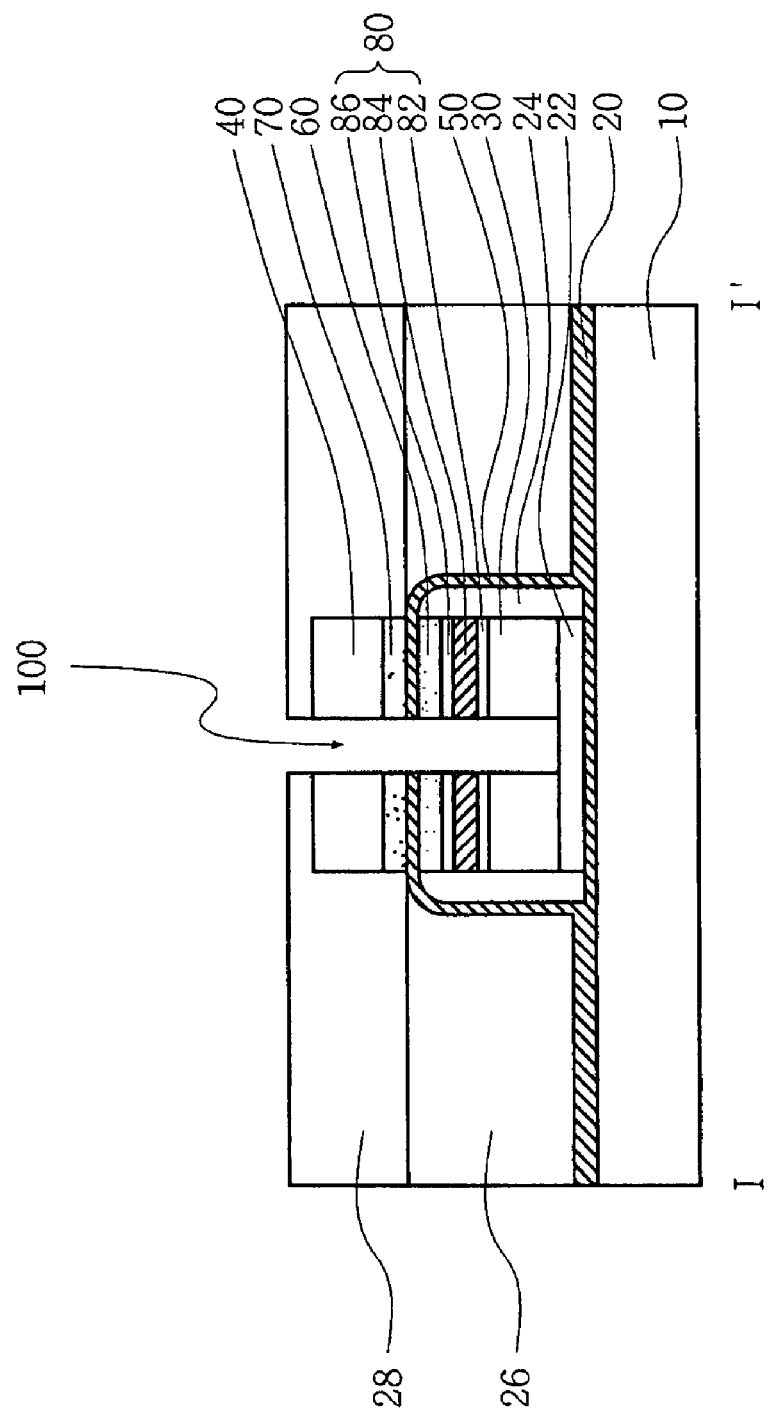

Referring to FIGS. 14A and 14B, the exposed reduced-width first hard mask layer 42 is selectively removed. Using the third interlayer dielectric layer 28 as an etch mask, a trench 100 is formed through the underlying read word line 40, the patterned second sacrificial layer 70, the patterned electrode layer 50, the patterned first sacrificial layer 60, the patterned charge trapping structure 80, and the write word line 30, to expose an upper surface of the patterned first interlayer dielectric layer 22 using a dry etch process. In this embodiment, the resulting trench 100 has a width that is defined by the width of the earlier-formed reduced-width first hard mask layer 42. The trench 100 extends in the second direction through approximately central regions of the read word line 50, the patterned electrode layer 50, the patterned charge trapping structure 80 and the write word line 30.

Figure 15A:
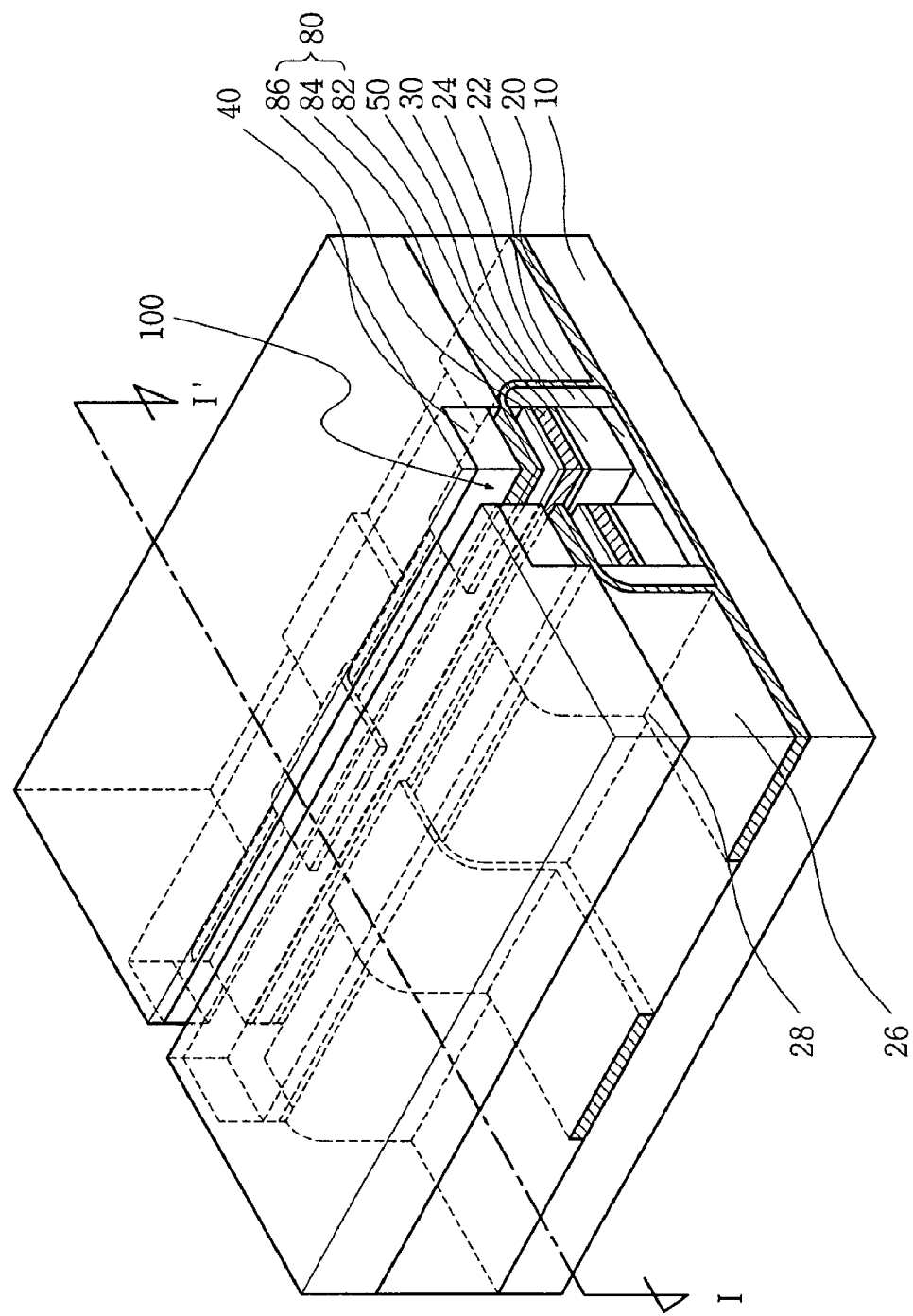
Figure 15B:
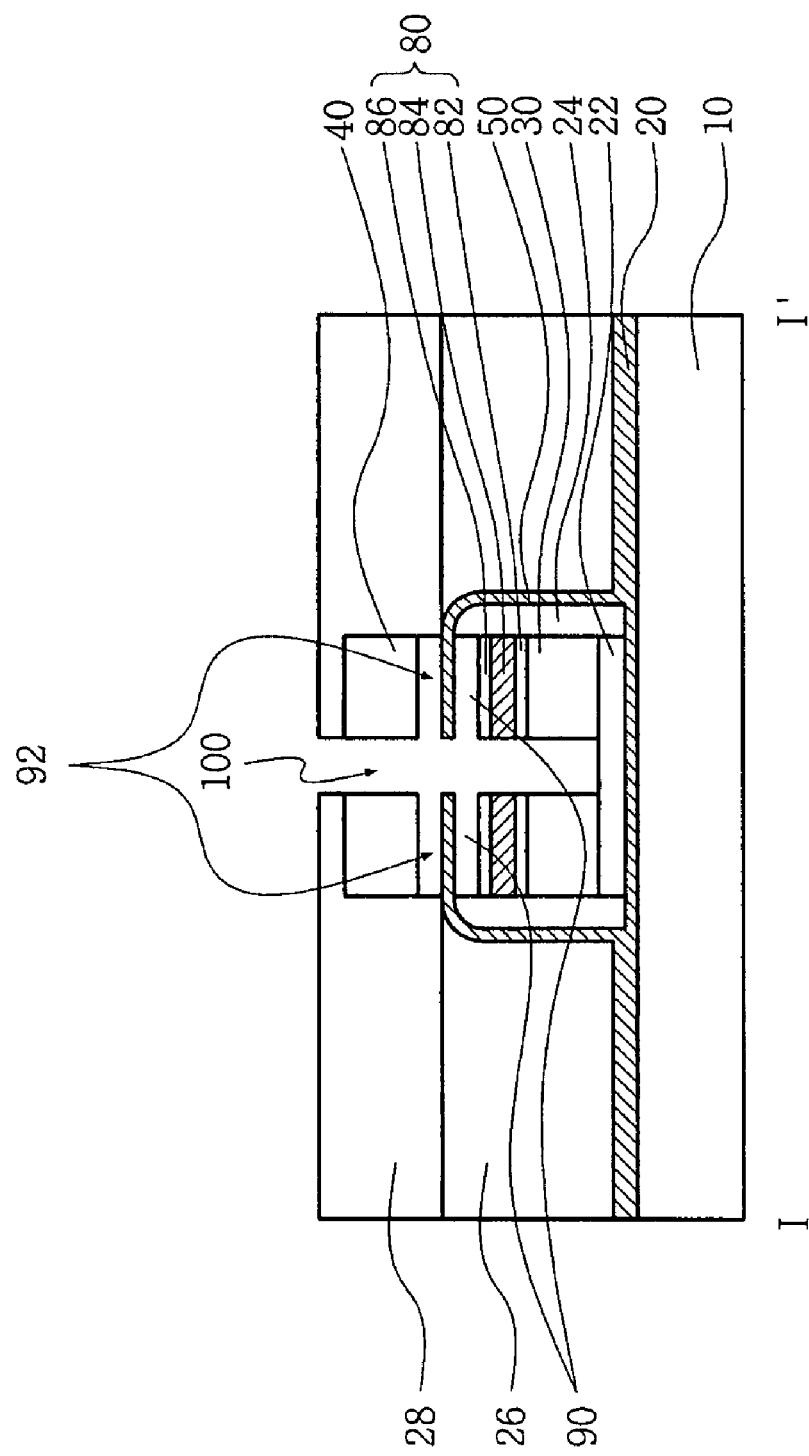

Referring to FIGS. 15A and 15B, the remaining portions of the patterned first sacrificial layer 60 and the patterned second sacrificial layer 70, that is, the portions that lie between the patterned charge trapping layer 80 and the patterned electrode layer 50, and between the patterned electrode layer 50 and the read word line 40, are removed. The remaining first and second sacrificial layers 60, 70 are removed, for example, using a wet etching process or a chemical dry etch (CDE) process. In this manner, lower gaps 90 are formed between the patterned electrode layer 50 and the patterned charge trapping structure 80, and upper gaps 92 are formed between the patterned electrode layer 50 and the read word line 40. The thicknesses of the applied first and second sacrificial layers 60, 70 thus define the resulting first and second gap distances 90, 92.

The resulting memory cell structure is shown and described above with reference to FIGS. 2A and 2B. The trench 100 partitions each unit cell 104 of the device into first and second memory units 102A, 102B, each of the first and second memory units 102A, 102B including a respective first and second upper word line 40A, 40B, a respective first and second electrode 50A, 50B, a respective first and second charge trapping layer 80A, 80B, and a respective first and second write word line 30A, 30B. The first and second memory units 102A, 102B of a common unit cell 104 share a bit line 20. The states of the first and second memory units 102A, 102B of the common unit cell 104 can each be programmed to have independent, same or different, states, to thereby provide a multi-bit structure, in this example, a dual-bit structure, that includes independently controlled write word lines, read word lines, and charge trapping structures, and a shared bit line.

While the non-volatile embodiments of the electromechanical memory devices of the present invention are described above, the principles of the present invention are equally applicable to volatile memory devices, and fabrication methods thereof. In one illustrative example, FIG. 16 is a sectional view of a multiple-bit electromechanical volatile memory device in accordance with an embodiment of the present invention.

Figure 16:
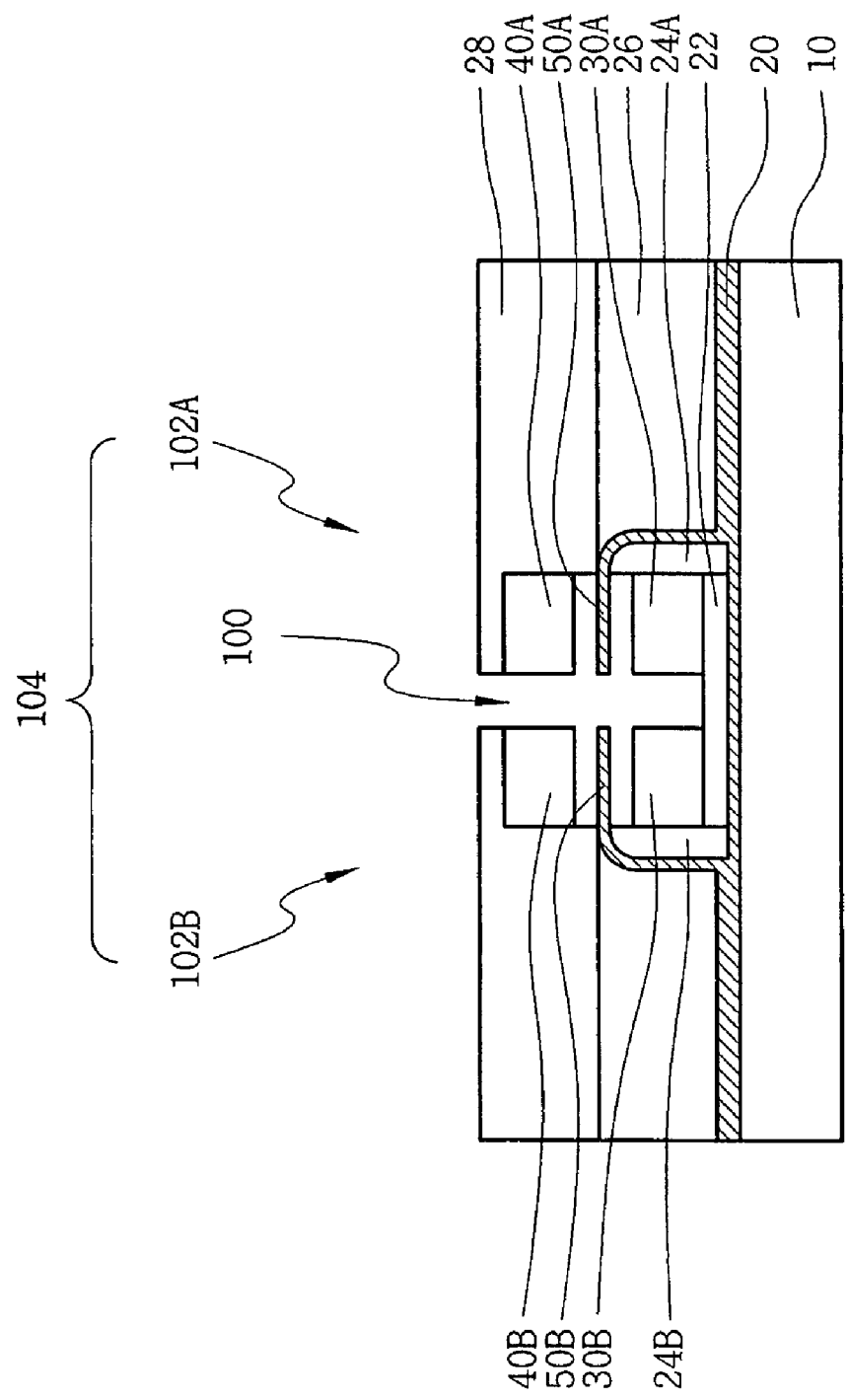
FIG. 16 is a sectional view of a multiple-bit electromechanical volatile memory device in accordance with an embodiment of the present invention.

The embodiment shown in FIG. 16 is substantially similar to the embodiment illustrated and described above in connection with FIGS. 2A and 2B; however, in the present embodiment, the charge trapping structure 80 that is present in the above-described non-volatile memory device embodiment, is absent. Therefore, in the present embodiment, lower and upper gaps 90, 92 are formed directly between the write word lines 30 and the electrodes 50, and directly between the read word lines 40 and the electrodes 50. Without the charge trapping structures of the above embodiments, when the applied voltage is removed from the write word lines 30A, 30B, the written information is not retained.

Figure 17A:
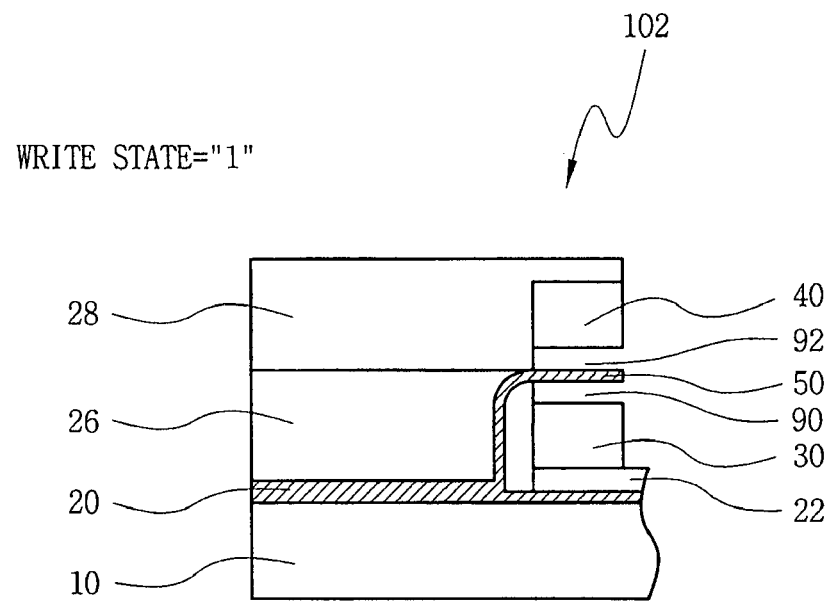
FIGS. 17A and 17B are sectional views of a memory unit in a first state and a read operation of the memory unit in the first state, for the volatile memory device embodiment of FIG. 16.
Figure 17B:
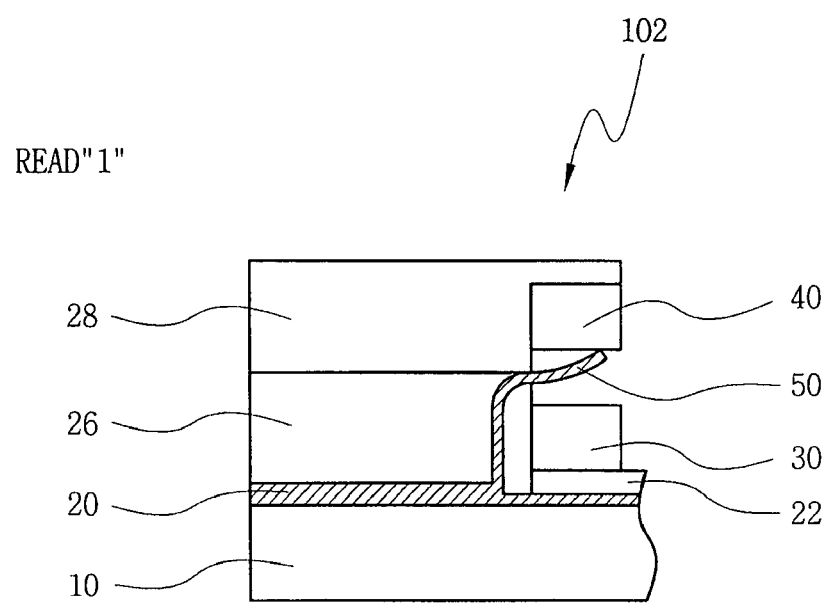

FIGS. 17A and 17B are sectional views of a memory unit 102 in a first state and a read operation of the memory unit in the first state, for the volatile memory embodiment of FIG. 16.

Referring to FIG. 17A, as a result of a write operation, the electrode 50 is in a rest position, that is, in a suspended position between the write word line 30 and the read word line 40, and not engaging either the write word line 30 or the read word line 40. In one embodiment, this position of the electrode corresponds with a "1" binary state for the memory unit 102; however, in another embodiment, the electrode 50 being in such a rest position could equally be considered to correspond with a "0" binary state for the memory unit 102.

In the state of "1" as shown in FIG. 17A, the electrode 50 is positioned at a suitable gap distance from the read word line 40 and remains in that position, until a subsequent write operation or read operation occurs. During a subsequent read operation of the memory unit 102, a voltage potential is applied between the read word line 40 and the bit line 20 that is sufficient in magnitude to cause the electrode to deflect from the rest position of FIG. 17A to an engaged position as shown in FIG. 17B, whereby the electrode is bent in an upward direction through the upper gap 92 so that its distal end 53 makes contact with a lower surface of the read word line 40. In this position, a current is generated between the read word line 40 and the bit line 20 that passes through the electrode 50. That current is sensed by current sensing circuitry which results in the read operation indicating a reading of a "1" state for the memory unit 102.

Figure 18A:
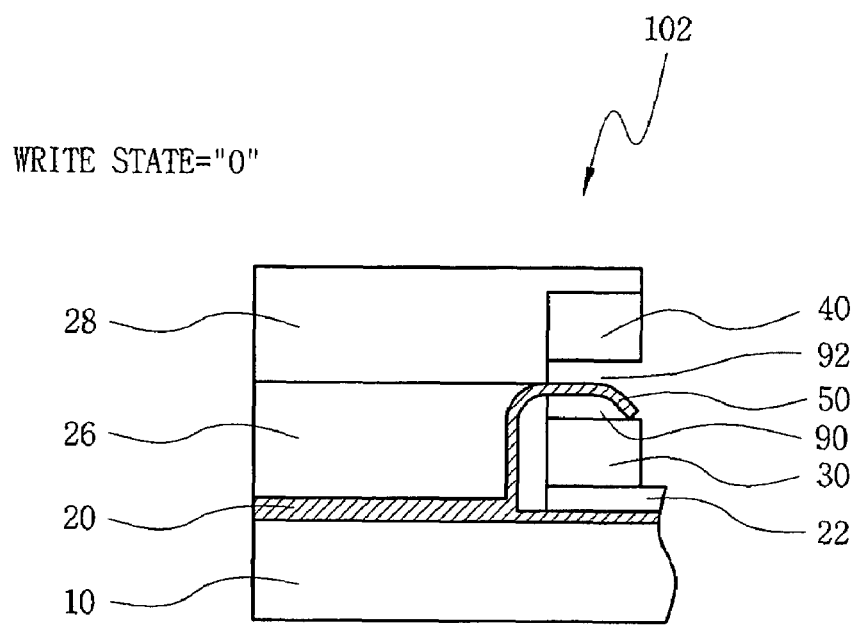
FIGS. 18A and 18B are sectional views of a memory unit in a second state and a read operation of the memory unit in the second state, for the volatile memory device embodiment of FIG. 16.
Figure 18B:
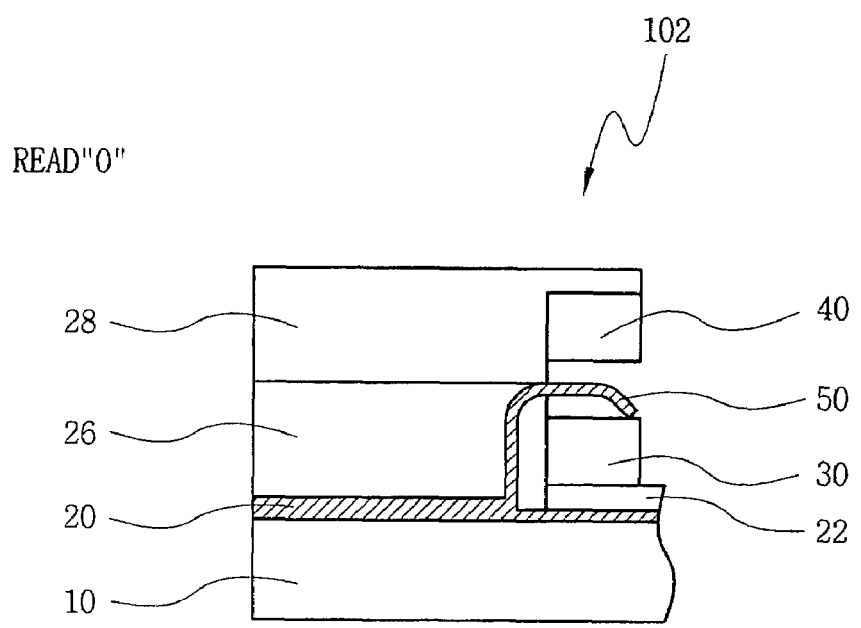

FIGS. 18A and 18B are sectional views of a memory unit 102 in a second state and a read operation of the memory unit 102 in the second state, in accordance with an embodiment of the present invention.

Referring to FIG. 18A, as a result of a write operation, the electrode 50 is in an engaged position, whereby the electrode 50 is bent in a downward direction and makes contact with an upper surface of the write word line 30. In one embodiment, this position of the electrode corresponds with a "0" binary state for the memory unit 102; however, in another embodiment, the electrode 50 being in such a bent position could equally be considered to correspond with a "1" binary state for the memory unit 102.

In the state of "0" as shown in FIG. 18A, the electrode 50 is bent to make contact with an upper surface of the write word line 30 and remains in that position, assuming a sustaining voltage is applied to the write word line, until a subsequent programming operation occurs. During a subsequent read operation of the memory unit 102, a voltage potential is applied between the read word line 40 and the bit line 20. A voltage potential for the read operation is selected that would have been sufficient in magnitude to cause the electrode 50 to deflect from the rest position of FIG. 17A to an engaged position with the lower surface of the read word line 40; however, the voltage potential applied between the read word line 40 and the bit line 20 for the read operation is not of sufficient magnitude so as to overcome the attractive force between the write word line 30 and the electrode 50. As a result, during a read operation of the memory unit 102 in the state shown in FIG. 18A, the electrode 50 remains in the same position, that is, in an engaged position with an upper surface of read word line 30. Thus, during the read operation, when the read operation voltage potential is applied to the read word line 40 and the bit line 20, no current is generated between the read word line 40 and the bit line 20, because the electrode 50 in the downward-bent position does not operate to close the current path between the read word line 40 and the bit line 20. The lack of current, as detected by the corresponding current sensing circuitry, results in the read operation indicating a reading of a "0" state for the memory unit 102.

Figure 19:
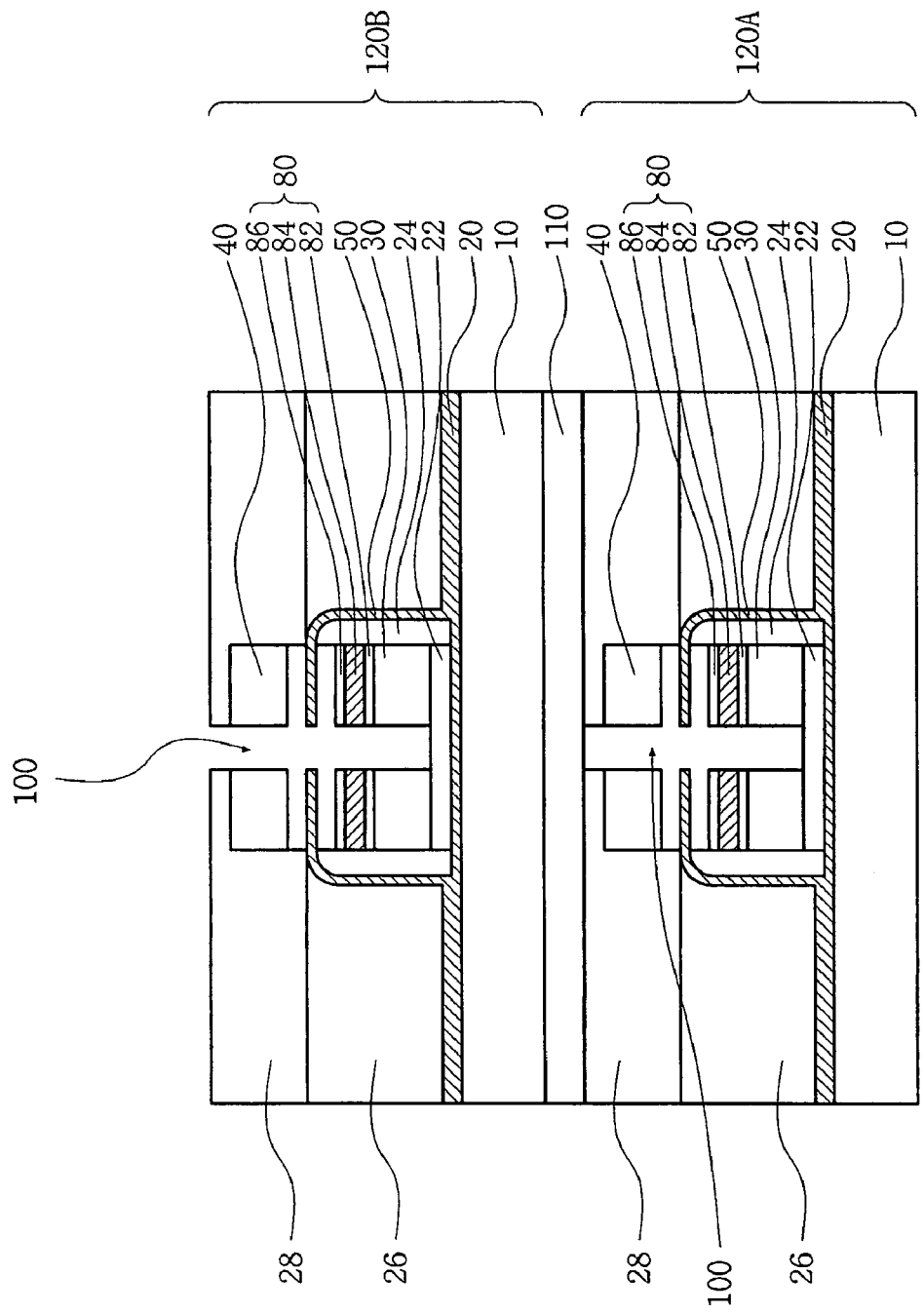
FIG. 19 is a sectional view of a stacked memory device including multiple layers of electromechanical memory cells, in accordance with an embodiment of the present invention.

FIG. 19 is a sectional view of a stacked memory device including multiple layers of electromechanical memory cells, in accordance with an embodiment of the present invention. In this embodiment, a first array of memory cells, for example of the non-volatile type described above, are provided on a first memory device layer 120A. An insulator layer 110 is provided on the first device layer, and a second array of memory cells, for example, of the non-volatile type described above, are provided on a second memory device layer 120B. The second memory device layer 120B is provided on the insulator layer. Each of the first and second memory device layers 120A, 120B include memory cells having electromechanical memory units with cantilevered electrodes, as described above. Additional device layers may be present above the second memory device layer 120B, or below the first memory device layer 120A, or between the first and second memory device layers 120A, 120B. The additional device layers can include memory cells and/or can include supporting circuitry, such as drive circuitry, for the stacked memory device.

Figure 20:
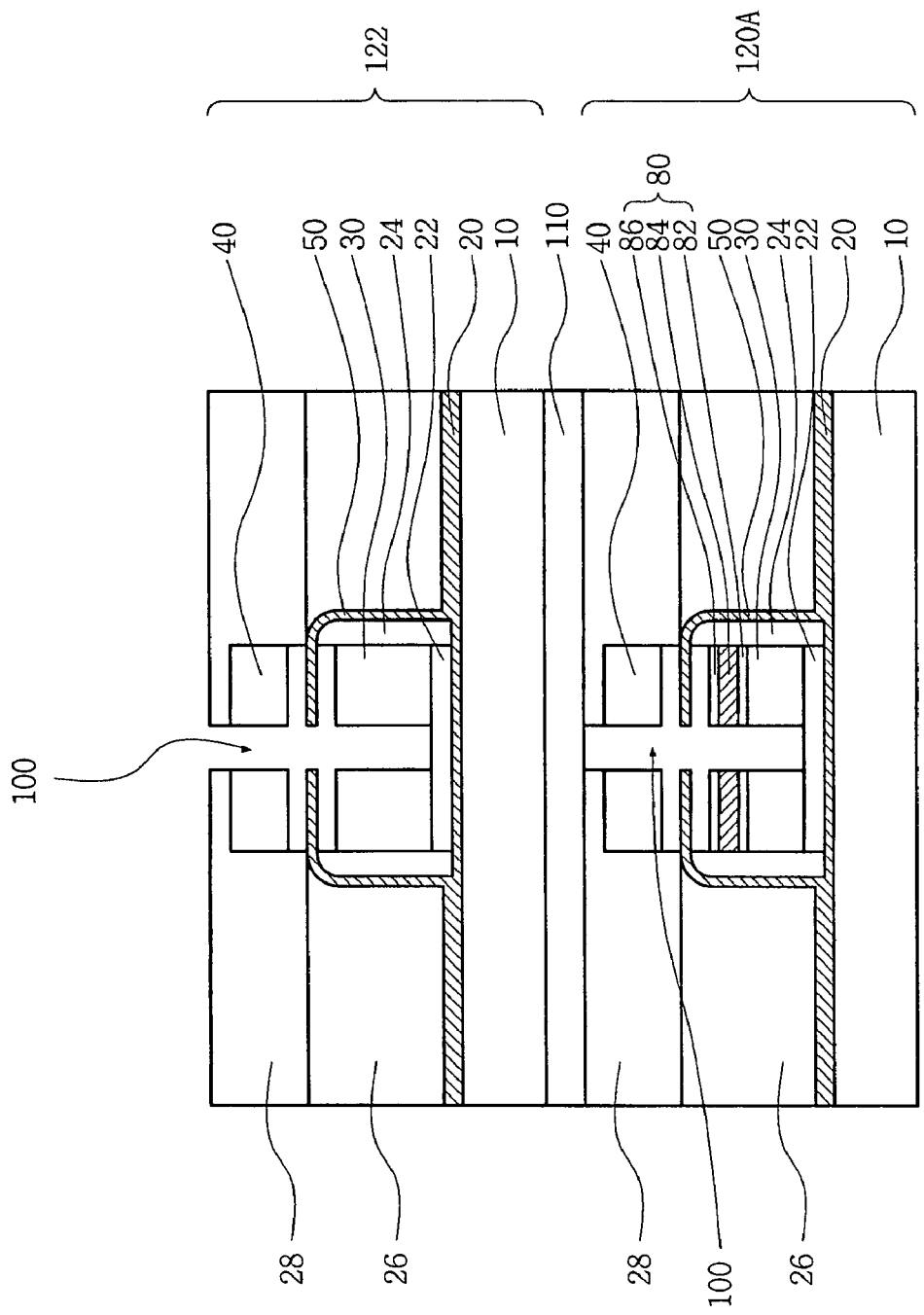
FIG. 20 is a sectional view of a stacked memory device including multiple layers of electromechanical memory cells, one of the layers including volatile memory cells and another of the layers including non-volatile memory cells, in accordance with an embodiment of the present invention.

FIG. 20 is a sectional view of a stacked memory device including multiple layers of electromechanical memory cells, one of the layers including volatile memory cells and another of the layers including non-volatile memory cells, in accordance with an embodiment of the present invention. In this embodiment, a first array of memory cells, for example of the non-volatile type described above, are provided on a first memory device layer 120A. An insulator layer 110 is provided on the first device layer, and a second array of memory cells of a different type, for example, of the volatile type described above, are provided on a second memory device layer 122. The second memory device layer 122 is provided on the insulator layer 110. Each of the first and second memory device layers 120A, 122 include memory cells having electromechanical memory units with cantilevered electrodes, as described above. Additional device layers may be present above the second memory device layer 122, or below the first memory device layer 120A, or between the first and second memory device layers 120A, 122. The additional device layers can include memory cells and/or can include supporting circuitry, such as drive circuitry, for the stacked memory device.

In this manner, embodiments are described above that are directed to multiple-bit electromechanical memory devices and methods of manufacture thereof that address and alleviate the above-identified limitations of conventional devices. In particular, embodiments of the present invention provide multiple-bit electromechanical memory devices that realize, among other features, high-density storage, low-voltage program and erase voltages, high-speed operation, enhanced data retention, and high long-term endurance, and methods of formation of such devices. The embodiments of the present invention are applicable to both non-volatile and volatile memory device formats.

While the invention has been particularly shown and described with references to preferred embodiments thereof, it will be understood by those skilled in the art that various changes in form and details may be made herein without departing from the spirit and scope of the invention as defined by the appended claims.

What is claimed is:

1. A memory device comprising:
a substrate;
a bit line on the substrate extending in a first direction;
a first word line structure on the bit line and spaced apart from, and insulated from, the bit line, the first word line structure extending in a second direction transverse to the first direction;
an electrode coupled to the bit line extending over the first word line structure and spaced apart from the first word line structure by a first gap; and
a second word line structure over the electrode and spaced apart from the electrode by a second gap, the second word line structure extending in the second direction,
wherein the electrode is cantilevered between the first word line structure and the second word line structure such that the electrode deflects to be electrically coupled with a top portion of the first word line structure through the first gap in a first bent position and deflects to be electrically coupled with a bottom portion of the second word line structure through the second gap in a second bent position, and is isolated from the first word line structure and the second word line structure in a rest position.

2. The memory device of claim 1 wherein the first word line structure comprises a write word line and wherein the second word line structure comprises a read word line.

3. The memory device of claim 1 further comprising a first dielectric that isolates the first word line structure and the bit line in a vertical direction relative to the substrate.

4. The memory device of claim 1 further comprising a second dielectric that isolates a side of the first word line structure and the electrode in a horizontal, direction relative to the substrate.

5. The memory device of claim 4 wherein the second dielectric comprises a spacer at a side wall of the first word line structure.

6. The memory device of claim 1 wherein the electrode comprises a first portion that extends in a direction along a sidewall of the first word line structure and a second portion that extends from the first portion in a direction along a top of the first word line structure, between the first word line structure and the second word line structure.

7. The memory device of claim 6 wherein the first portion of the electrode includes a first end that is anchored to the second portion and a second end that deflects through the first gap and the second gap.

8. The memory device of claim 1 wherein the electrode comprises an elastically deformable material.

9. The memory device of claim 8 wherein the electrode comprises at least one material selected from the group consisting of: gold, silver, copper, aluminum, tungsten, TiN, conductive metal, shaped memory alloy, and nanotubes.

10. The memory device of claim 1 wherein the first word line structure and second word line structure each comprise a conductor, and wherein the memory device comprises a volatile memory device.

11. The memory device of claim 1 wherein at least one of the first word line structure and the second word line structure comprises:
a conductive layer; and
a charge trapping structure between the conductive layer and the electrode and spaced apart from the electrode by a corresponding one of the first and second gaps, and wherein the memory device comprises a non-volatile memory device.

12. The memory device of claim 11 wherein in at least one of the first bent position and second bent position, the electrode is capacitively coupled to the charge trapping structure of the corresponding at least one first word line structure and second word line structure.

13. The memory device of claim 12 wherein in the at least one of the first bent position and second bent position, the electrode is further capacitively coupled to the conductive layer of the corresponding at least one first word line structure and second word line structure.

14. The memory device of claim 11 wherein the charge trapping structure comprises a structure selected from the group consisting of: an oxide-nitride-oxide (ONO) structure and an oxide-nitride-alumina (ONA) structure.

15. The memory device of claim 11 further comprising a transition layer between the conductive layer and the charge trapping structure of the at least one of the first and second word line structures.

16. The memory device of claim 11 wherein one of the first and second word line structures comprises a write word line structure and wherein another of the first and second word line structures comprises a read word line structure, and wherein, during a write operation of the non-volatile memory device, the electrode is placed in one of the a bent position in contact with the write word line structure and the rest position, by applying a first voltage potential between the write word line structure and the bit line.

17. The memory device of claim 16 wherein during a write operation of a first state of the non-volatile memory device that results, in the electrode being placed in a bent position in contact with the write word line structure, the electrode bends to make contact with the charge trapping structure of the write word line structure in the bent position in response to the first voltage potential between the write word line structure and the bit line, and wherein, when the first voltage potential between the write word line structure and the bit line is removed, the electrode remains in the bent position as a result of charge that is trapped in the charge trapping structure of the write word line structure.

18. The memory device of claim 17 wherein during a read operation of the non-volatile memory device in the first state, a second voltage potential is applied between the bit line and the read word line structure, and wherein the read operation results in the determination of the first state when the electrode remains in the bent position in contact with the write word line structure, despite application of the second voltage potential.

19. The memory device of claim 16 wherein during a write operation of a second state of the non-volatile memory device that results in the electrode being placed in the rest position, the electrode is isolated from the charge trapping structure of the write word line structure in the rest position in response to the first voltage potential between the write word line structure and the bit line, and wherein, when the first voltage potential between the write word line structure and the bit line is removed, the electrode remains in the rest position.

20. The memory device of claim 19 wherein during a read operation of the non-volatile memory device in the second state, a second voltage potential is applied between the bit line and the read word line structure, and wherein the read operation results in the determination of the second state when the electrode is placed in a bent position in contact with the read word line structure as a result of the applied second voltage potential.

21. The memory device of claim 1 wherein the first word line structure comprises a conductive layer and a charge trapping structure on the conductive layer, the charge trapping structure between the conductive layer of the first word line structure and the electrode, and the charge trapping structure being spaced apart from the electrode by the first gap, and wherein the memory device comprises a non-volatile memory device.

22. The memory device of claim 1 wherein the second word line structure comprises a conductive layer and a charge trapping structure under the conductive layer, the charge trapping structure between the conductive layer of the second word line structure and the electrode, and the charge trapping structure being spaced apart from the electrode by the second gap, and wherein the memory device comprises a non-volatile memory device.

23. A memory device comprising:
a substrate;
a bit line on the substrate extending in a first direction;
a first word line structure on the bit line and spaced apart from, and insulated from, the bit line, the first word line structure extending in a second direction transverse to the first direction;
an electrode coupled to the bit line extending over the first word line structure and spaced apart from the first word line structure by a first gap; and
a second word line structure over the electrode and spaced apart from the electrode by a second gap, the second word line structure extending in the second direction,
wherein one of the first word line structure and second word line structure comprises a charge trapping structure between a conductive layer of the one of the word line structures and the electrode, wherein the charge trapping structure is spaced apart from the electrode by a corresponding one of the respective first and second gaps;
wherein the electrode is cantilevered between the first word line structure and the second word line structure such that the electrode deflects to be electrically coupled with a top portion of the first word line structure through the first gap in a first bent position and deflects to be electrically coupled with a bottom portion of the second word line structure through the second gap in a second bent position, and is isolated from the first word line structure and the second word line structure in a rest position.

24. The memory device of claim 23 wherein the one of the first and second word line structures comprises a write word line and wherein the other of the first and second word line structures comprises a read word line.

25. The memory device of claim 23 wherein the electrode comprises a first portion that extends in a direction along a sidewall of the first word line structure and a second portion that extends from the first portion in a direction along a top of the first word line structure, between the first word line structure and the second word line structure.

26. The memory device of claim 25 wherein the first portion of the electrode includes a first end that is anchored to the second portion and a second end that deflects through the first gap and the second gap.

27. The memory device of claim 23 wherein the electrode comprises an elastically deformable material.

28. The memory device of claim 27 wherein the electrode comprises at least one material selected from the group consisting of: gold, silver, copper, aluminum, tungsten, TiN, conductive metal, shaped memory alloy, and nanotubes.

29. The memory device of claim 23 wherein in at least one of the first bent position and second bent position, the electrode is capacitively coupled to the charge trapping structure of the corresponding at least one first word line structure and second word line structure.

30. The memory device of claim 29 wherein in the at least one of the first bent position and second bent position, the electrode is further capacitively coupled to the conductive layer of the corresponding at least one first word line structure and second word line structure.

31. The memory device of claim 23 wherein the charge trapping structure comprises a structure selected from the group consisting of: an oxide-nitride-oxide (ONO) structure and an oxide-nitride-alumina (ONA) structure.

32. The memory device of claim 23 further comprising a transition layer between the conductive layer and the charge trapping structure of the at least one of the first and second word line structures.

33. The memory device of claim 23 wherein the one of the first and second word line structures comprises a write word line structure and wherein the other of the first and second word line structures comprises a read word line structure, and wherein, during a write operation of the non-volatile memory device, the electrode is placed in one of the a bent position in contact with the write word line structure and the rest position, by applying a first voltage potential between the write word line structure and the bit line.

34. The memory device of claim 33 wherein during a write operation of a first state of the non-volatile memory device that results in the electrode being placed in a bent position in contact with the write word line structure, the electrode bends to make contact with the charge trapping structure of the write word line structure in the bent position in response to the first voltage potential between the write word line structure and the bit line, and wherein, when the first voltage potential between the write word line structure and the bit line is removed, the electrode remains in the bent position as a result of charge that is trapped in the charge trapping structure of the write word line structure.

35. The memory device of claim 34 wherein during a read operation of the non-volatile memory device in the first state, a second voltage potential is applied between the bit line and the read word line structure, and wherein the read operation results in the determination of the first state when the electrode remains in the bent position in contact with the write word line structure, despite application of the second voltage potential.

36. The memory device of claim 33 wherein during a write operation of a second state of the non-volatile memory device that results in the electrode being placed in the rest position, the electrode is isolated from the charge trapping structure of the write word line structure in the rest position in response to the first voltage potential between the write word line structure and the bit line, and wherein, when the first voltage potential between the write word line structure and the bit line is removed, the electrode remains in the rest position.

37. The memory device of claim 36 wherein during a read operation of the non-volatile memory device in the second state, a second voltage potential is applied between the bit line and the read word line structure, and wherein the read operation results in the determination of the second state when the electrode is placed in a bent position in contact with the read word line structure as a result of the applied second voltage potential.

38. A dual-bit memory device comprising:
a substrate;
a bit line on the substrate extending in a first direction;
first and second lower word line structures on the bit line, the first and second lower word line structures being spaced apart from each other and spaced apart from, and insulated from, the bit line, each of the first and second lower word line structures extending in a second direction transverse to the first direction;
first and second electrodes coupled to the bit line, the first electrode extending over the first lower word line structure and spaced apart from the first lower word line structure by a first lower gap; the second electrode extending over the second lower word line structure and spaced apart from the second lower word line structure by a second lower gap; and
first and second upper word line structures over the respective first and second electrodes, the first and second upper word line structures being spaced apart from each other, the first upper word line structure being spaced apart from the first electrode by a first upper gap, the second upper word line structure being spaced apart from the second electrode by a second upper gap, each of the first and second upper word line structures extending in the second direction,
wherein at least one pair of the first and second lower word line structures and the first and second upper word line structures comprises first and second charge trapping structures between first and second conductive layers of the respective first and second word line structures and the corresponding first and second electrodes, wherein the first and second charge trapping structures are spaced apart from the respective first and second electrodes by the respective first and second gaps,
wherein the first electrode is cantilevered between the first lower word line structure and the first upper word line structure such that the first electrode deflects to be electrically coupled with a top portion of the first lower word line structure through the first lower gap in a first bent position and deflects to be electrically coupled with a bottom portion of the first upper word line structure through the first upper gap in a second bent position, and is isolated from the first lower word line structure and the first upper word line structure in a rest position, and
wherein the second electrode is cantilevered between the second lower word line structure and the second upper word line structure such that the second electrode deflects to be electrically coupled with a top portion of the second lower word line structure through the second lower gap in a first bent position and deflects to be electrically coupled with a bottom portion of the second upper word line structure through the second upper gap in a second bent position, and is isolated from the second lower word line structure and the second upper word line structure in a rest position.

39. The dual-bit memory device of claim 38 wherein the first and second electrodes each include a first end that is anchored and a second end that deflects through the first gap and the second gap.

40. The dual-bit memory device of claim 38 wherein the first and second electrodes each comprise an elastically deformable material.

41. The dual-bit memory device of claim 38 wherein, in at least one of the first bent position and second bent position, an electrode is capacitively coupled to the charge trapping structure of the corresponding at least one upper and lower word line structure.

42. The dual-bit memory device of claim 38 wherein in the at least one of the first bent position and second bent position, the electrode is further capacitively coupled to the conductive layer of the corresponding at least one upper and lower word line structure.

43. The dual-bit memory device of claim 38 wherein the charge trapping structure comprises a structure selected from the group consisting of: an oxide-nitride-oxide (ONO) structure and an oxide-nitride-alumina (ONA) structure.

44. The dual-bit memory device of claim 38 further comprising a transition layer between the conductive layer and the charge trapping structure of corresponding at least one upper and lower word line structures.

45. The dual-bit memory device of claim 38 wherein one pair of the first and second lower word line structures and first and second upper word. line structures comprises first and second write word line structures including the respecting first and second charge trapping structures and wherein another pair of the first and second lower word line structures and first and second upper word line structures comprises first and second read word line structures and wherein, during a write operation of the memory device:
the first electrode is placed in either a bent position in contact with the charge trapping structure of the first write word line structure corresponding to a first state of the first electrode, or in the rest position corresponding to a second state of the first electrode, by applying a first voltage potential between the first write word line structure and the bit line; and
the second electrode is placed in either a bent position in contact with the charge trapping structure of the second write word line structure corresponding to a first state of the second electrode or in the rest position corresponding to a second state of the second electrode, by applying a second voltage potential between the second write word line structure and the bit line, the programmed first and second states of the respective first and second electrodes being independent of each other, depending on the applied respective first and second voltage potentials.

46. The dual-bit memory device of claim 45 wherein:
when the first voltage potential between the first write word line structure and the bit line is removed, the first electrode remains in the bent position as a result of charge that is trapped in the first charge trapping structure of the first write word line structure; and
when the second voltage potential between the second write word line structure and the bit line is removed, the second electrode remains in the bent position as a result of charge that is trapped in the second charge trapping structure of the second write word line structure.

47. The dual-bit memory device of claim 46 wherein during a read operation of the memory device:
a third voltage potential is applied between the bit line and the first read word line structure, and wherein the read operation results in the determination of the first state when the first electrode remains in the bent position in contact with the first charge trapping structure of the first write word line structure despite application of the third voltage potential, and wherein the read operation results in the determination of the second state when the first electrode is placed in a bent position in contact with the first read word line structure as a result of application of the third voltage potential; and
a fourth voltage potential is applied between the bit line and the second read word line structure, and wherein the read operation results in the determination of the first state when the second electrode remains in the bent position in contact with the second charge trapping structure of the second write word line structure despite application of the fourth voltage potential, and wherein the read operation results in the determination of the second state when the second electrode is placed in a bent position in contact with the second read word line structure as a result of application of the fourth voltage potential.

48. The dual-bit memory device of claim 47 wherein the read operations of the respective first and second electrodes are performed by applying the corresponding third and fourth voltage potentials at different times.

49. The dual-bit memory device of claim 48 wherein the electrode comprises at least one material selected from the group consisting of: gold, silver, copper, aluminum, tungsten, TiN, conductive metal, shaped memory alloy, and nanotubes.

50. A dual-bit memory device comprising:
a substrate;
a bit line on the substrate extending in a first direction;
first and second lower word lines on the bit line, the first and second lower word lines being spaced apart from each other and spaced apart from, and insulated from, the bit line, each of the first and second lower word lines extending in a second direction transverse to the first direction;
first and second electrodes coupled to the bit line, the first electrode extending over the first lower word line and spaced apart from the first lower word line by a first lower gap; the second electrode extending over the second lower word line and spaced apart from the second lower word line by a second lower gap; and
first and second upper word lines over the respective first and second electrodes, the first and second upper word lines being spaced apart from each other, the first upper word line being spaced apart from the first electrode by a first upper gap, the second upper word line being spaced apart from the second electrode by a second upper gap, each of the first and second upper word lines extending in the second direction,
wherein the first electrode is cantilevered between the first lower word line and the first upper word line such that the first electrode deflects to be electrically coupled with a top portion of the first lower word line through the first lower gap in a first bent position and deflects to be electrically coupled with a bottom portion of the first upper word line through the first upper gap in a second bent position, and is isolated from the first lower word line and the first upper word line in a rest position, and
wherein the second electrode is cantilevered between the second lower word line and the second upper word line such that the second electrode deflects to be electrically coupled with a top portion of the second lower word line through the second lower gap in a first bent position and deflects to be electrically coupled with a bottom portion of the second upper word line through the second upper gap in a second bent position, and is isolated from the second lower word line and the second upper word line in a rest position.

51. The dual-bit memory device of claim 50 wherein the first and second electrodes each include a first end that is anchored and a second end that deflects through the first gap and the second gap.

52. The dual-bit memory device of claim 50 wherein the first and second electrodes each comprise an elastically deformable material.

53. The dual-bit memory device of claim 50 wherein one pair of the first and second lower word lines and first and second upper word lines comprises first and second write word lines and wherein another pair of the first and second lower word lines and first and second upper word lines comprises first and second read word lines and wherein, during a write operation of the memory device:
the first electrode is placed in either a bent position in contact with the first write word line corresponding to a first state of the first electrode, or in the rest position corresponding to a second state of the first electrode, by applying a first voltage potential between the first write word line and the bit line; and
the second electrode is placed in either a bent position in contact with the second write word line corresponding to a first state of the second electrode or in the rest position. corresponding to a second state of the second electrode, by applying a second voltage potential between the second write word line and the bit line,
the programmed first and second states of the respective first and second electrodes being independent of each other, depending on the applied respective first and second voltage potentials.

54. The dual-bit memory device of claim 53 wherein during a read operation of the memory device:
a third voltage potential is applied between the bit line and the first read word line, and wherein the read operation results in the determination of the first state when the first electrode remains in the bent position in contact with the first write word line despite application of the third voltage potential, and wherein the read operation results in the determination of the second state when the first electrode is placed in a bent position in contact with the first read word line as a result of application of the third voltage potential; and
a fourth voltage potential is applied between the bit line and the second read word line, and wherein the read operation results in the determination of the first state when the second electrode remains in the bent position in contact with the second write word line despite application of the fourth voltage potential, and wherein the read operation results in the determination of the second state when the second electrode is placed in a bent position in contact with the second read word line as a result of application of the fourth voltage potential.

55. The dual-bit memory device of claim 54 wherein the read operations of the respective first and second electrodes are performed by applying the corresponding third and fourth voltage potentials at different times.

* * * * *

UNITED STATES PATENT AND TRADEMARK OFFICE
CERTIFICATE OF CORRECTION

PATENT NO. : 7,573,739 B2  Page 1 of 1
APPLICATION NO. : 11/713770
DATED : August 11, 2009
INVENTOR(S) : Eunjung Yun et al.

It is certified that error appears in the above-identified patent and that said Letters Patent is hereby corrected as shown below:

Column 28, line 66 delete ","
Column 32, line 47 delete "."
Column 34, line 45 delete "."

Signed and Sealed this

Tenth Day of November, 2009

David J. Kappos
*Director of the United States Patent and Trademark Office*